(12) United States Patent
Cui et al.

(10) Patent No.: US 11,578,404 B2
(45) Date of Patent: Feb. 14, 2023

(54) SYNTHESIS OF CARBON-BASED NANOSTRUCTURES USING EUTECTIC COMPOSITIONS

(71) Applicant: Massachusetts Institute of Technology, Cambridge, MA (US)

(72) Inventors: Kehang Cui, Allston, MA (US); Brian L. Wardle, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 379 days.

(21) Appl. No.: 16/622,117

(22) PCT Filed: Jun. 13, 2018

(86) PCT No.: PCT/US2018/037244
§ 371 (c)(1),
(2) Date: Dec. 12, 2019

(87) PCT Pub. No.: WO2018/231925
PCT Pub. Date: Dec. 20, 2018

(65) Prior Publication Data
US 2020/0123652 A1    Apr. 23, 2020

Related U.S. Application Data

(60) Provisional application No. 62/519,115, filed on Jun. 13, 2017.

(51) Int. Cl.
*C23C 16/26*    (2006.01)
*C23C 16/02*    (2006.01)
*C23C 16/50*    (2006.01)

(52) U.S. Cl.
CPC .......... *C23C 16/26* (2013.01); *C23C 16/0209* (2013.01); *C23C 16/50* (2013.01)

(58) Field of Classification Search
CPC ...... C23C 16/0209; C23C 16/26; C23C 16/50
See application file for complete search history.

(56) References Cited

U.S. PATENT DOCUMENTS 2,810,636 A    10/1957    Kirk
7,537,825 B1    5/2009    Wardle et al.
(Continued)

FOREIGN PATENT DOCUMENTS

CN    102502584 A    6/2012
CN    102574688 A    7/2012
(Continued)

OTHER PUBLICATIONS

Sytchev et al; Influence of current density on the erosion of a graphite cathode and electrolytic formation of carbon nanotubes in molten NaCl and LiCl; Electrochimica Acta 54 (2009), pp. 6725-6731. (Year: 2009).*
(Continued)

*Primary Examiner* — Elizabeth A Burkhart
(74) *Attorney, Agent, or Firm* — Wolf, Greenfield & Sacks, P.C.

(57) ABSTRACT

The instant disclosure is related to the growth of carbon-based nanostructures and associated systems and products. Certain embodiments are related to carbon-based nanostructure growth using active growth materials comprises at least two components that are capable of forming a eutectic composition with each other. In some embodiments, the growth of carbon-based nanostructures is performed using active growth materials comprising at least two types of cations.

34 Claims, 11 Drawing Sheets

(56) References Cited

U.S. PATENT DOCUMENTS

| | | | |
|---|---|---|---|
| 8,257,678 | B2 | 9/2012 | Steiner, III et al. |
| 8,865,109 | B2 | 10/2014 | Steiner, III et al. |
| 9,540,243 | B2 | 1/2017 | Steiner, III et al. |
| 10,035,706 | B2 | 7/2018 | Steiner, III et al. |
| 10,087,079 | B2 | 10/2018 | Steiner, III et al. |
| 10,988,382 | B2 * | 4/2021 | Wardle .................. C01B 32/18 |
| 2011/0027162 | A1 | 2/2011 | Steiner, III et al. |
| 2011/0162957 | A1 * | 7/2011 | Wardle .................. B82Y 30/00 |
| | | | 204/157.63 |
| 2012/0147448 | A1 | 6/2012 | Yaniv et al. |
| 2013/0072077 | A1 | 3/2013 | Steiner, III et al. |
| 2013/0142987 | A1 | 6/2013 | Wardle et al. |
| 2013/0270188 | A1 | 10/2013 | Karnik et al. |
| 2013/0272951 | A1 | 10/2013 | Hiura et al. |
| 2014/0295166 | A1 | 10/2014 | Steiner, III et al. |
| 2014/0374960 | A1 | 12/2014 | Cojocaru |
| 2015/0224479 | A1 | 8/2015 | Cho et al. |
| 2020/0299135 | A1 | 9/2020 | Wardle et al. |

FOREIGN PATENT DOCUMENTS

| | | |
|---|---|---|
| CN | 104891472 A | 9/2015 |
| KR | 10-2012-0116232 A | 10/2012 |
| WO | WO 2007/136755 A2 | 11/2007 |
| WO | WO 2012/091789 A1 | 7/2012 |
| WO | WO 2013/044053 A1 | 3/2013 |
| WO | WO 2017/173032 A1 | 10/2017 |

OTHER PUBLICATIONS

International Search Report and Written Opinion dated Aug. 30, 2018 for Application No. PCT/US2018/037244.

International Preliminary Report on Patentability dated Dec. 26, 2019 for Application No. PCT/US2018/037244.

Wu et al., One-pot synthesis of nanostructured carbon materials from carbon dioxide via electrolysis in molten carbonate salts. Carbon. Sep. 2016;106:208-17.

Extended European Search Report dated Feb. 18, 2020 for Application No. 17776624.3.

International Search Report and Written Opinion dated Jun. 22, 2017 for Application No. PCT/US2017/024928.

International Preliminary Report on Patentability dated Oct. 11, 2018 for Application No. PCT/US2017/024928.

No Author Listed, High-performance structural fibers for advanced polymer matrix composites. Committee on High-Performance Structural Fibers for Advanced Polymer Matrix Composites, National Research Council. ISBN: 0-309-54943-4, 70 pages. 2005. http://www.nap.edu/catalog/11268.html.

No Author Listed, Fischer-Tropsch synthesis. 18 pages. http://www.tc2.ch.tum.de/fileadmin/tuchtc2/www/ICP1/ICP1_1314/9-FT_synthesis-2013_PW.pdf.

Addison et al., The reactions of acetylene and propyne at the surface of liquid sodium. J Chem Soc A. 1971;0:1704-8.

Antunes et al., Comparative study of first- and second-order Raman spectra of MWCNT at visible and infrared laser excitation. Carbon. Sep. 2006;44(11):2202-11.

Avouris et al., Carbon-based electronics. Nat Nanotechnol. Oct. 2007;2(10):605-15. doi: 10.1038/nnano.2007.300. Epub Sep. 30, 2007.

Barisci et al., Electrochemical characterization of single-walled carbon nanotube electrodes. J Electrochem Soc. 2000. 147(12):4580-3.

Bhaviripudi et al., CVD Synthesis of single-walled carbon nanotubes from gold nanoparticle catalysts. J Am Chem Soc. 2007;129(6):1516-7. Epub Jan. 19, 2007.

Bussy et al., Intracellular fate of carbon nanotubes inside murine macrophages: pH-dependent detachment of iron catalyst nanoparticles. Part Fibre Toxicol. Jun. 25, 2013;10:24(1-12). doi: 10.1186/1743-8977-10-24.

Cao et al., Super-compressible foamlike carbon nanotube films. Science. Nov. 25, 2005;310(5752):1307-10.

Cheng et al., Sodium-promoted iron catalysts prepared on different supports for high temperature Fischer—Tropsch synthesis. Appl Catalysis A: General. Aug. 5, 2015;502:204-14. Epub Jun. 16, 2015.

Chu, Planes, trains and automobiles: faster, stronger, lighter. MIT News. May 20, 2013. 3 pages.

De Volder et al., Carbon nanotubes: present and future commercial applications. Science. Feb. 1, 2013;339(6119):535-9. doi: 10.1126/science.1222453.

Ding et al.., Growth of high-density parallel arrays of long single-walled carbon nanotubes on quartz substrates. J Am Chem Soc. 2008;130(16):5428-9.

Ding et al., Selective growth of well-aligned semiconducting single-walled carbon nanotubes. Nano Lett. 2009;9(2):800-5. Epub Jan. 20, 2009.

Esconjauregui et al., The reasons why metals catalyze the nucleation and growth of carbon nanotubes and other carbon nanomorphologies. Carbon. Mar. 2009;47(3):659-69. Epub Nov. 13, 2008.

Estrade-Szwarckopf, XPS photoemission in carbonaceous materials: A "defect" peak beside the graphitic asymmetric peak. Carbon. 2004;42(8-9):1713-21. Epub Apr. 1, 2004.

Evanoff et al., Towards ultrathick battery electrodes: aligned carbon nanotube-enabled architecture. Adv Mater. Jan. 24, 2012;24(4):533-7. doi: 10.1002/adma.201103044. Epub Dec. 27, 2011.

Ferrari et al., Resonant Raman spectroscopy of disordered, amorphous, and diamondlike carbon. Phys Rev B. Jul. 26, 2001;64:075414(1-13).

Forster et al., CVD-grown CNTs on basalt fiber surfaces for multifunctional composite interphases. Fibers. 2016;4(4):28(1-13). doi:10.3390/fib4040028. 13 pages. Epub Nov. 23, 2016.

Fredriksson et al., A thermodynamic assessment of the Fe-Pt system. CALPHAD. Dec. 2001;25(4):535-48.

Gartner et al., Oxidative dehydrogenation of ethane on dynamically rearranging supported chloride catalysts. J Am Chem Soc. 2014;136(36):12691-701. Epub Aug. 13, 2014.

Guernsey et al., The Thermal Dissociation of Sodium Carbide. J Am Chem Soc. Jan. 8, 1926;48(1):140-6.

Hobbs, Radiation Effects in Analysis of Inorganic Specimens by TEMm., Chapter 17 in Introduction to Analytical Electron Microscopy, pp. 437-480. Springer-Verlag, US, 1979.

Hofmann et al., In situ observations of catalyst dynamics during surface-bound carbon nanotube nucleation. Nano Lett. Mar. 2007;7(3):602-8. Epub Feb. 24, 2007.

Hong et al., Controlling the growth of single-walled carbon nanotubes on surfaces using metal and non-metal catalysts. Carbon. May 2012;50(6):2067-82. Epub Jan. 20, 2012.

Iijima et al., Single-shell carbon nanotubes of 1-nm diameter. Nature. Jun. 17, 1993;363:603-5.

Jensen et al., Nanotube radio. Nano Lett. Nov. 2007;7(11):3508-11. Epub Oct. 31, 2007.

Jung et al., Mechanism of selective growth of carbon nanotubes on $SiO_2$/Si Patterns. Nano Lett. 2003;3(4):561-4.

Kathyayini et al., Catalytic activity of Fe, Co and Fe/Co supported on Ca and Mg oxides, hydroxides and carbonates in the synthesis of carbon nanotubes. J Mol Catalyst A: Chem. Dec. 1, 2004;223(1-2):129-36.

Knoche et al., Chemical Reactions of $CO_2$ in Water. Biophysics and Physiology of Carbon Dioxide: Symposium Held at the University of Regensburg (FRG), Apr. 17-20, 1979. Springer Berlin Heidelburg, 1980. pp 3-11.

Komaba et al., Electrochemical Na insertion and solid electrolyte interphase for hard?carbon electrodes and application to Na-Ion batteries. Adv Funct Mater. Oct. 2011;21(20):3859-67.

Kudo et al., CVD growth of carbon nanostructures from zirconia: mechanisms and a method for enhancing yield. J Am Chem Soc. Dec. 24, 2014;136(51):17808-17. doi: 10.1021/ja509872y. Epub Dec. 9, 2014.

Lee et al., Out-of-oven curing of polymeric composites via resistive microheaters comprised of aligned carbon nanotube networks. Proc of 20th Intl Conf on Composite Materials (ICCM20). Jul. 19-24, 2015. Copenhagen, Denmark. 9 pages.

(56) References Cited

OTHER PUBLICATIONS

Li et al., How catalysts affect the growth of single-walled carbon nanotubes on substrates. Adv Mater. Apr. 2010;22(13):1508-15. Epub Mar. 5, 2010.
Li et al., Hierarchical carbon nanotube carbon fiber unidirectional composites with preserved tensile and interfacial properties. Compos Sci Technol. Sep. 29, 2015;117:139-45. Epub Apr. 30, 2015.
Li et al. Woven hierarchical aerospace composite laminates with aligned carbon nanotube bulk reinforcement. Proc of 57th AiAA/ASCE/AHS/ASC Structures, Structural Dynamics, and Materials Conference. Jan. 4-8, 2016. San Diego, CA. http://arc.aiaa.org. doi: 10.2514/6.2016-0149. pp. 1-9.
Lin et al., Direct evidence of atomic-scale structural fluctuations in catalyst nanoparticles. J Catal. May 2017;349:149-55. Epub Apr. 3, 2017.
Liu et al., Thermodynamic descriptions for Au—Fe and Na—Zn binary systems. J Alloys Compounds. May 2009;476(1-2):79-83. Epub Oct. 23, 2008.
Ma et al., Potassium effects on activated-carbon-supported iron catalysts for Fischer-Tropsch synthesis. Energy Fuels. 2007:21(4):1832-42. Epub Jun. 13, 2007.
Magrez et al., Evidence of an equimolar C2H2—CO2 reaction in the synthesis of Evidence of an Equimolar C2H2—CO2 Reaction in the Synthesis of Carbon Nanotubes. Angew Chem Int Ed. Dec. 5, 2006. 441-4.
Magrez et al., Low-temperature, highly efficient growth of carbon nanotubes on functional materials by an oxidative dehydrogenation reaction. ACS Nano. 2010;4(7):3702-8.
Magrez et al., Supporting Information—Evidence of an Equimolar C2H2—CO2 Reaction in the Synthesis of Carbon Nanotubes. Angew Chem Int Ed. Dec. 5, 2006. 4 pages, doi: 10.1002/anie. 200603764.
Maynard et al., Exposure to carbon nanotube material: aerosol release during the handling of unrefined single-walled carbon nanotube material. J Toxicol Environ Health A. Jan. 9, 2004;67(1):87-107.
McConnell, The making of carbon fiber. Composites World. Jan. 2009. Epub Dec. 19, 2008. http://www.compositesworld.com/articles/the-making-of-carbon-fiber. 7 pages.
Nikparsa et al., Impact of Na promoter on structural properties and catalytic performance of CoNi/Al2O3 nanocatalysts for the CO hydrogenation process: Fischer-Tropsch technology. Catalysis Lett. Jan. 2016;146(1):61-71. Epub Sep. 8, 2015.
Niu et al., High power electrochemical capacitors based on carbon nanotube electrodes. Appl Phys Lett. Mar. 17, 1997;70(11):1480-2.
Novoselov et al., Electric field effect in atomically thin carbon films. Science. Oct. 22, 2004;306(5696):666-9.
Pan et al., Carbon nanotubes for supercapacitator. Nanoscale Res Lett. 2010;5(3):654-68. Epub Jan. 5, 2010.
Peng et al., Measurements of near-ultimate strength for multiwalled carbon nanotubes and irradiation-induced crosslinking improvements. Nat Nanotechnol. Oct. 2008;3(10):626-31. doi: 10.1038/nnano.2008.211. Epub Aug. 10, 2008.
Piao et al., Brightening of carbon nanotube photoluminescence through the incorporation of sp3 defects. Nat Chem. Oct. 2013;5(10):840-5. doi: 10.1038/nchem.1711. Epub Jul. 21, 2013.
Picher et al., Nucleation of graphene and its conversion to single-walled carbon nanotubes. Nano Lett. Nov. 12, 2014;14(11):6104-8. doi: 10.1021/nl501977b. Epub Oct. 20, 2014.
Pocsik et al., Origin of the D peak in the raman spectrum of microcrystalline graphite. J Non-Crystall Solids. May 1998;227-30:1083-6.
Qian et al., Hierarchical composites reinforced with carbon nanotube grafted fibers: The potential assessed at the single fiber level. Chem Mater. 2008;20(5):1862-9. Epub Feb. 9, 2008.
Qi et al., Large-scale and controllable synthesis of metal-free carbon nanofibers and carbon nanotubes over water-soluble Na2CO3. Mat Lett. Aug. 15, 2012;81:135-7.

Qu et al., Carbon nanotube arrays with strong shear binding-on and easy normal lifting-off. Science. Oct. 10, 2008;322(5899):238-42. doi: 10.1126/science.1159503.
Ren et al., One-pot synthesis of carbon nanofibers from CO2. Nano Lett. 2015;15(9):6142-8. Epub Aug. 3, 2015.
Sager et al. Effect of carbon nanotubes on the interfacial shear strength of T650 carbon fiber in an epoxy matrix. Compos Sci Technol. 2009;69:898-904.
Sangster et al., The Co—-Na (Cobalt-Sodium) system. Bulletin of Alloy Phase Diagrams. Oct. 1990;11(5):442-3.
Sharma et al., Site-specific fabrication of Fe particles for carbon nanotube growth. Nano Lett. Feb. 2009;9(2):689-94. doi: 10.1021/nl803180e. Epub Jan. 22, 2009.
Shulaker et al., Carbon nanotube computer. Nature. Sep. 26, 2013;501(7468):526-30. doi: 10.1038/nature12502. Including Suppl Info (5 pages).
Shvedova et al., Exposure to carbon nanotube material: assessment of nanotube cytotoxicity using human keratinocyte cells. J Toxicol Environ Health A. Oct. 24, 2003;66(20):1909-26.
Slome, American Chemical Society, Patent Watch. These catalysts promote the oxidative coupling of methane to ethylene. Feb. 2, 2015. 3 pages. https://www.acs.org/content/acs/en/patent-watch/2015-archive/february-2.html.
Stein et al., Aligned carbon nanotube array stiffness from stochastic three-dimensional morphology. Nanoscale. 2015;7:19426-31. Including Electronic Suppl Info. S1-S9.
Steiner, Carbon Nanotube Growth on Challenging Substrates: Applications for Carbon-Fiber Composites. PhD Thesis. Massachusetts Institute of Technology. Submitted Dec. 2011. 315 pages.
Steiner et al., Circumventing the mechanochemical origins of strength loss in the synthesis of hierarchical carbon fibers. ACS Appl Mater Interf. Jun. 12, 2013;5(11):4892-903. Epub Apr. 24, 2013.
Sun et al., Flexible high-performance carbon nanotube integrated circuits. Nat Nanotechnol. Mar. 2011;6(3):156-61. doi: 10.1038/nnano.2011.1. Epub Feb. 6, 2011.
Takagi et al., Single-walled carbon nanotube growth from highly activated metal nanoparticles. Nano Lett. 2006;6(12):2642-5. Epub Nov. 23, 2006.
Tans et al., Room-temperature transistor based on a single carbon nanotube. Nature. May 7, 1998;393(6680):49-52.
Uner et al., The role of alkali promoters in Fischer-Tropsch synthesis on Ru/SiO2 surfaces. Topics in Catalysis. Mar. 1995;2(1-4):59-69.
Van Noorden, The trials of new carbon. Nature. Jan. 6, 2011;469(7328):14-6. doi: 10.1038/469014a.
Waki et al., Non-nitrogen doped and non-metal oxygen reduction electrocatalysts based on carbon nanotubes: mechanism and origin of ORR activity. Energy Environ Sci. 2014;7:1950-8.
Wang et al., Carbon nanotubes: A bright future for defects. Nat Chem. Oct. 2013;5(10):812-3. doi: 10.1038/nchem.1768.
Wicks et al., Interlaminar and intralaminar reinforcement of composite laminates with aligned carbon nanotubes. Comps Sci Technol. Jan. 2010;70(1):20-28. doi:10.1016/j.compscitech.2009.09.001. Epub Sep. 12, 2009.
Wirth et al., The phase of iron catalyst nanoparticles during carbon nanotube growth. Chem Mater. 2012;24(24):4633-40. Epub Nov. 28, 2012.
Xiao et al., Flexible, stretchable, transparent carbon nanotube thin film loudspeakers. Nano Lett. Dec. 2008;8(12):4539-45. doi: 10.1021/nl802750z. Epub Oct. 29, 2008.
Xu et al., Carbon nanotube growth from alkali metal salt nanoparticles. Carbon. Dec. 2014;80:490-5. Epub Sep. 4, 2014. Including Suppl Info (5 pages).
Xu et al., Carbon nanotubes with temperature-invariant viscoelasticity from -196 degrees to 1000 degrees C. Science. Dec. 3, 2010;330(6009): 1364-8. doi: 10.1126/science.1194865.
Xu et al., Fabrication, characterization, purification and photoluminescence properties of carbon nanomaterials over water-soluble alkali salts. Mat Res Bull. Feb. 2016;74:218-25.
Yoshida et al., Atomic-scale in-situ observation of carbon nanotube growth from solid state iron carbide nanoparticles. Nano Lett. Jul. 2008;8(7):2082-6. doi: 10.1021/nl080452q. Epub May 28, 2008.

(56) References Cited

OTHER PUBLICATIONS

Zhang et al., Synthesis of carbon nanofibers and nanotubes by chemical vapor deposition using a calcium carbonate catalyst. Mater Lett. 2013;92:342-5. Epub Nov. 10, 2012.

Zhang et al., Arrays of horizontal carbon nanotubes of controlled chirality grown using designed catalysts. Nature. Mar. 9, 2017;543:234-8. Including Suppl Info (10 pages).

Zhou et al., Copper catalyzing growth of single-walled carbon nanotubes on substrates. Nano Lett. 2006;6(12):2987-90. Epub Nov. 10, 2006.

Magrez et al., Catalytic CVD Synthesis of Carbon Nanotubes: Towards High Yield and Low Temperature Growth. Materials (Basel). Nov. 1, 2010;3(11):4871-4891.

U.S. Appl. No. 16/088,199, filed Sep. 25, 2018, Wardle et al.

17776624.3, Feb. 18, 2020, Extended European Search Report.

17776624.3, Jun. 22, 2017, International Search Report and Written Opinion.

17776624.3, Oct. 11, 2018, International Preliminary Report on Patentability.

\* cited by examiner

SYNTHESIS OF CARBON-BASED NANOSTRUCTURES USING EUTECTIC COMPOSITIONS

RELATED APPLICATIONS

This application is a national stage entry under 35 U.S.C. § 371 of International Patent Application No. PCT/US2018/037244, filed Jun. 13, 2018, and entitled "Synthesis of Carbon-Based Nanostructures Using Eutectic Compositions," which claims priority to U.S. Provisional Application No. 62/519,115, filed Jun. 13, 2017, and entitled "Synthesis of Carbon-Based Nanostructures Using Eutectic Compositions," each of which is incorporated herein by reference in its entirety for all purposes.

TECHNICAL FIELD

Growth of carbon-based nanostructures and associated systems and products are generally described.

BACKGROUND

The production of carbon-based nanostructures may potentially serve as an important tool in the production of a broad array of emerging applications including electronics and structural materials. Recent research has focused on the production of, for example, carbon nanotubes (CNTs) through chemical vapor deposition (CVD) and other techniques. The selection of an appropriate material on which to form the nanostructures is important when designing processes for the production of carbon nanostructures. However, many commonly used materials have one or more disadvantages associated with them.

Accordingly, improved compositions and methods are needed.

SUMMARY

The instant disclosure is related to the growth of carbon-based nanostructures and associated systems and products. Certain embodiments are related to carbon-based nanostructure growth using active growth materials comprising at least two components that are capable of forming a eutectic composition with each other. In some embodiments, carbon-based nanostructures are grown using active growth materials comprising at least two types of cations. The subject matter of the present invention involves, in some cases, interrelated products, alternative solutions to a particular problem, and/or a plurality of different uses of one or more systems and/or articles.

In one aspect, methods of growing carbon-based nanostructures are described.

In some embodiments, the method comprises exposing a precursor of the carbon-based nanostructures to an active growth material to grow the carbon-based nanostructures from the precursor of the carbon-based nanostructures. The active growth material may comprise at least two components that are capable of forming a eutectic composition with each other.

According to certain embodiments, the method comprises exposing a precursor of the carbon-based nanostructures to an active growth material to grow the carbon-based nanostructures from the precursor of the carbon-based nanostructures, wherein the active growth material comprises a first type of cation that is an alkali metal cation or an alkaline earth metal cation, a second type of cation that is different from the first type of cation and is an alkali metal cation or an alkaline earth metal cation, and an anion.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
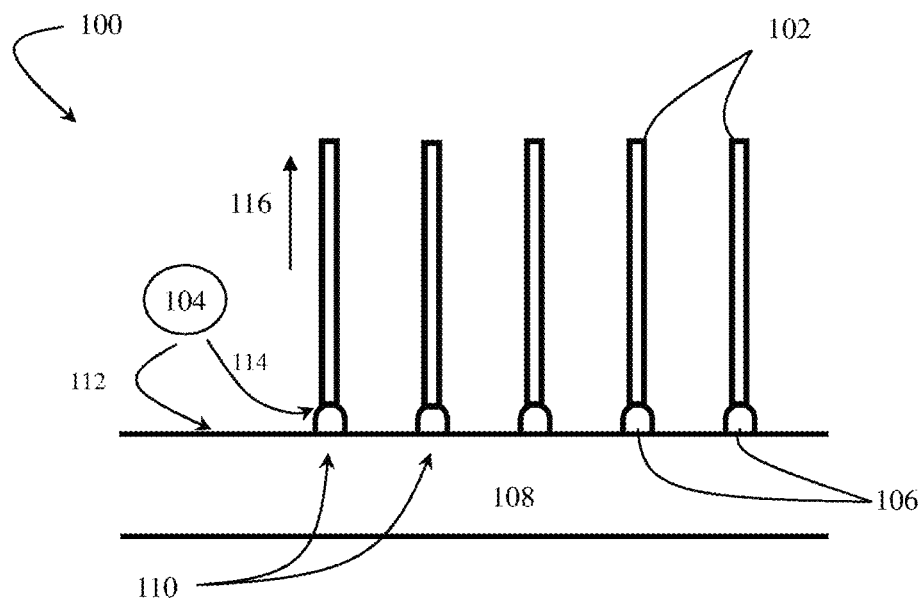
FIG. 1A is a cross-sectional schematic illustration showing a method of growing carbon-based nanostructures, according to certain embodiments.

Systems and methods for the growth of carbon-based nanostructures are generally described. In some embodiments, the nanostructures may be grown on an active growth material. The active growth material, or a precursor thereof, may comprise at least two components that are capable of forming a eutectic composition with each other in certain embodiments. In some embodiments, the active growth material, or a precursor thereof, may comprise at least two types of cations and comprise an anion. When present, the first type of cation may be an alkali metal cation or an alkaline earth metal cation, and the second type of cation may be an alkali metal cation or an alkaline earth metal cation. The carbon-based nanostructures may be grown by exposing a precursor of the carbon-based nanostructures to the active growth material, in the presence or absence of a growth substrate, such that the carbon-based nanostructures are grown from the precursor. This may be achieved, for example, by exposing the precursor and the active growth material to a set of conditions that causes growth (e.g., nucleation and/or additional growth) of carbon-based nanostructures on the active growth material. In some such embodiments, one or more of the conditions can be selected to form carbon-based nanostructures from the precursor on the active growth material.

Without wishing to be bound by any particular theory, it is believed that the use of active growth materials comprising components capable of forming a eutectic composition can, according to certain although not necessarily all embodiments, allow for the growth of carbon-based nanostructures at relatively low temperatures. It is also believed that certain active growth materials described herein may promote growth of carbon-based nanostructures when in the liquid phase and/or when at a temperature close to their melting temperature. Certain of the active growth materials described herein have relatively low melting temperatures and may promote carbon-based nanostructure growth at relatively low temperatures. For example, components that are capable of forming eutectic compositions with each other have reduced melting points at the eutectic composition and at compositions surrounding the eutectic composition in comparison to compositions in which the components are present in other relative amounts. As another example, compositions comprising alkali metal cations and/or alkaline earth metal cations have relatively low melting points in comparison to compositions comprising other metal cations. The ability to grow carbon-based nanostructures at relatively low temperatures can be advantageous as it may, according to certain although not necessarily all embodiments, reduce the amount of energy required to grow the carbon-based nanostructures and/or allow for the growth of carbon-based nanostructures on temperature sensitive substrates (e.g., polymers and other temperature sensitive substrates), as described in more detail below.

As described in more detail below, certain of the systems and methods described herein may be used to grow a variety of carbon-based nanostructures, including carbon nanotubes, carbon nanofibers, and carbon nanowires. Certain embodiments described herein may be particularly useful, in certain cases, for growing carbon nanotubes.

As noted above, certain embodiments are related to methods of growing carbon-based nanostructures. According to some embodiments, the method of growing carbon-based nanostructures comprises providing an active growth material or an active growth material precursor and exposing a precursor of the carbon-based nanostructures to the active growth material or active growth material precursor comprising at least two components that are capable of forming a eutectic composition with each other and/or comprising at least two types of cations, each of which are alkali metal cations or alkaline earth metal cations, and an anion to grow the carbon-based nanostructures from the precursor. It should be understood that, where active growth materials and their associated properties are described below and elsewhere herein, either or both of the active growth material itself and the active growth material precursor may have the properties described as being associated with the active growth material. In some embodiments, the active growth material and/or the active growth material precursor has these properties upon being exposed to the carbon-based nanostructure precursor. In certain embodiments, the active growth material and/or the active growth material precursor has these properties at the beginning of a heating step used to form the carbon-based nanostructures. In certain embodiments, the active growth material and/or the active growth material precursor has these properties at at least one point in time during which the material is in a chamber or other vessel within which the carbon-based nanostructures are grown.

Figure 1B:
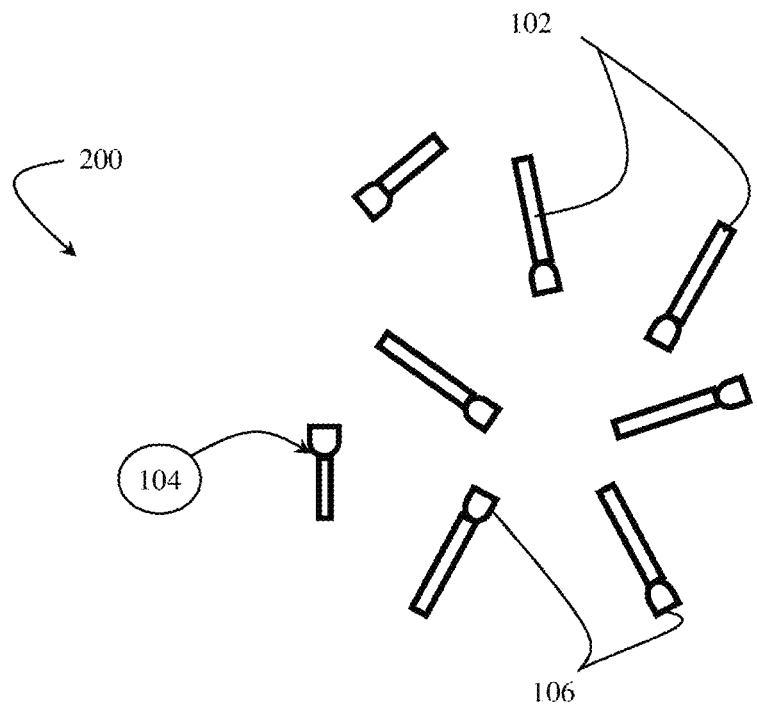
FIG. 1B is, in accordance with some embodiments, a cross-sectional schematic illustration showing a method of growing carbon-based nanostructures in the absence of a substrate.

An exemplary system 100 for growing carbon-based nanostructures is shown in FIG. 1A. In FIG. 1A, carbon-based nanostructures 102 are grown by exposing active growth material 106 to precursor 104 of carbon-based nanostructures 102. As illustrated in FIG. 1A, active growth material 106 is in contact (e.g., direct contact) with optional growth substrate 108, but in other embodiments, the active growth material is not in contact with a growth substrate. For example, in FIG. 1B, active growth material 106 is not in contact with an underlying substrate. In some embodiments, the active growth material may be in contact with the substrate prior to a growth process, but may be displaced from the substrate during a growth process by a growing carbon-based nanostructure.

Active growth material 106 (e.g., a nanoparticle of active growth material) can comprise at least two components that are capable of forming a eutectic composition with each other in some embodiments. In some embodiments, active growth material 106 may comprise a first type of cation, a second type of cation different from the first type of cation, and an anion. The first type of cation and the second type of cation may each be an alkali metal cation or an alkaline earth metal cation. Specific examples of active growth materials are described in more detail below. According to certain embodiments, the active growth material catalyzes the growth of the carbon-based nano structures.

It should be understood that the growth of carbon-based nanostructures can include the initial nucleation/formation of the carbon-based nanostructure and/or making an existing carbon-based nanostructure larger in size. In certain embodiments, the growth of the carbon-based nanostructures comprises nucleating or otherwise forming the carbon-based nanostructures from material that is not a carbon-based nanostructure. In some embodiments, two or more carbon-based nanostructures may nucleate or otherwise form from a material that is not a carbon-based nanostructure. The two or more carbon-based nanostructures may be the same type of carbon-based nanostructure, or may be different types of carbon-based nanostructures. In some embodiments, the growth of the carbon-based nanostructures comprises making an existing carbon-based nanostructure larger in size. The growth process can also include both of these steps, in some cases. In certain embodiments, multiple growth steps can be performed, for example, using a single active growth material to grow carbon-based nanostructures multiple times.

The precursor of the carbon-based nanostructures can be exposed to the active growth material in a number of ways. Generally, exposing the active growth material to the precursor comprises combining the precursor and the active growth material with each other such that they are in contact. According to certain embodiments, exposing the precursor of the carbon-based nanostructures to the active growth material comprises adding the precursor of the carbon-based nanostructures to the active growth material. In certain embodiments, exposing the precursor of the carbon-based nanostructures to the active growth material comprises adding the active growth material to the precursor of the carbon-based nanostructures. In still other embodiments, the precursor of the carbon-based nanostructures and the active growth material can be mixed simultaneously. Other methods of exposure are also possible. Exposing the precursor of the carbon-based nanostructures to an active growth material can occur, according to some embodiments, in a chamber or other volume. The volume in which the precursor of the carbon-based nanostructures is exposed to the active growth material may be fully enclosed, partially enclosed, or completely unenclosed.

As noted above, according to certain embodiments, the precursor of the carbon-based nanostructures can be exposed to the active growth material to grow the carbon-based nanostructures from the precursor. For example, in FIG. 1A, nanostructure precursor material 104, may be delivered to optional substrate 108 and contact or permeate the substrate surface (e.g., via arrow 112), the active growth material surface (e.g., via arrow 114), and/or the interface between the active growth material and the substrate (e.g., via arrow 110).

According to certain embodiments, carbon from the precursor of the carbon-based nanostructures may be dissociated from the precursor. The dissociation of the carbon from the precursor can, according to certain embodiments, involve the breaking of at least one covalent bond. In other cases, the dissociation of the carbon from the precursor does not involve breaking a covalent bond. The carbon dissociated from the precursor may, according to certain embodiments, chemically react to grow the carbon-based nanostructures via the formation of new covalent bonds (e.g., new carbon-carbon covalent bonds). In the growth of carbon nanotubes, for example, the nanostructure precursor material may comprise carbon, such that carbon dissociates from the precursor molecule and may be incorporated into the growing carbon nanotube via the formation of new carbon-carbon covalent bonds. Referring to FIG. 1A, according to certain embodiments, nanostructure precursor 104 may comprise carbon, such that carbon dissociates from nanostructure precursor 104 (optionally, breaking a covalent bond) and is incorporated into growing carbon-based nanostructures 102. The growing carbon-based nanostructures may, for example, extend upward from the growth substrate in general direction 116 with continued growth.

As described in more detail below, a variety of materials can be used as the precursor of the carbon-based nanostructures and as the active growth material (or a precursor of the active growth material). According to certain embodiments, carbon-based nanostructures (e.g., carbon nanotubes) may be synthesized using $CO_2$ and acetylene as precursors of the carbon-based nanostructures. In some such embodiments, the active growth material, or a precursor thereof, comprises nanoparticles of $Li_xK_yCl_z$ salts, which optionally may be arranged on a carbon fiber support (e.g., a sized, unsized, or desized carbon fiber support). Other examples of nanostructure precursor materials, active growth materials, precursors of active growth materials, and the types of carbon-based nanostructures that may be grown using these materials are described in more detail below.

In some embodiments, the method of growing carbon-based nanostructures comprises exposing the active growth material and the precursor of the carbon-based nanostructures to a set of conditions that causes growth of carbon-based nanostructures on the active growth material. Growth of the carbon-based nanostructures may comprise, for example, heating the precursor of the carbon-based nanostructures, the active growth material, or both. Other examples of suitable conditions under which the carbon-based nanostructures may be grown are described in more detail below. In some embodiments, growing carbon-based nanostructures comprises performing chemical vapor deposition (CVD) of nanostructures on the active growth material. In some embodiments, the chemical vapor deposition process may comprise a plasma chemical vapor deposition process. Chemical vapor deposition is a process known to those of ordinary skill in the art, and is explained, for example, in Dresselhaus M S, Dresselhaus G., and Avouris, P. eds. "Carbon Nanotubes: Synthesis, Structure, Properties, and Applications" (2001) Springer, which is incorporated herein by reference in its entirety. Examples of suitable nanostructure fabrication techniques are discussed in more detail in International Patent Application Serial No. PCT/US2007/011914, filed May 18, 2007, entitled "Continuous Process for the Production of Nanostructures Including Nanotubes," published as WO 2007/136755 on Nov. 29, 2007, which is incorporated herein by reference in its entirety.

As noted above, according to certain embodiments, carbon-based nanostructures can be grown by exposing the nanostructure precursor to an active growth material. As used herein, the term "active growth material" refers to a material that, when exposed to a set of conditions selected to cause growth of nanostructures, either enables growth of nanostructures that would otherwise not occur in the absence of the active growth material under essentially identical conditions, or increases the rate of growth of nanostructures relative to the rate that would be observed under essentially identical conditions but without the active growth material. "Essentially identical conditions," in this context, means conditions that are similar or identical (e.g., pressure, temperature, composition and concentration of species in the environment, etc.), other than the presence of the active growth material. In some embodiments, the active growth material can be part of a larger material (e.g., when the active growth material corresponds to a doped portion of a structure doped with an active material such as an alkali or alkaline earth metal the like). In other cases, the active growth material can be a single, standalone structure (e.g., when the active growth material is a particle comprising at least two components that are capable of forming a eutectic composition with each other, when the active growth material is a particle comprising at least a first type of cation, at least a second type of cation different from the first type of cation, and an anion, etc.). In certain embodiments, the active growth material is active throughout its exposed surface. In some embodiments, the active growth material is active throughout at least some or all of its volume.

In accordance with certain embodiments, the active growth material is not incorporated into the carbon-based nanostructures during growth. For example, the active growth material, according to certain embodiments, is not covalently bonded to the carbon-based nanostructure grown from the precursor. In some embodiments, the active growth material is incorporated into the carbon-based nanostructure during growth. For example, growth may result in the formation of a material that comprises a carbon-based nanostructure surrounding the active growth material (e.g., a carbon nanotube where at least a portion of the active growth material is disposed inside the carbon nanotube, a carbon nanotube where at least a portion of the active growth material lines an inner wall of a carbon nanotube).

In some embodiments, the active growth material lowers the activation energy of the chemical reaction used to grow the carbon-based nanostructures from the precursor. According to certain embodiments, the active growth material catalyzes the chemical reaction(s) by which the carbon-based nanostructures are grown from the precursor.

In certain embodiments, the active growth material is formed from an active growth material precursor which undergoes a phase change or chemical change prior to carbon-based nanostructure growth. As noted above, it should be understood that, where active growth materials and their associated properties are described elsewhere herein, either or both of the active growth material itself and the active growth material precursor may have the properties described as being associated with the active growth material. In some embodiments, an active growth material precursor may be provided (e.g., applied to an optional substrate) in one form and then undergo a physical or chemical transition (e.g., during a heating step, during exposure to a nanostructure precursor) prior to forming the active growth material. For example, in some embodiments, the active growth material precursor may melt, become oxidized or reduced, become activated, or undergo any physical or chemical change prior to forming the active growth material. Generally, in embodiments in which the active growth material is formed from a precursor and comprises at least two components that are capable of forming a eutectic composition with each other, the two components that are capable of forming a eutectic composition with each other of the active growth material correspond to the two components that are capable of forming a eutectic composition with each other of the active growth material precursor from which it is formed. Likewise, in embodiments in which the active growth material is formed from a precursor and comprises at least two types of cation and an anion, the two types of cations and the anion of the active growth material correspond to the two types of cations and the anion of the active growth material precursor from which it is formed. Of course, according to certain embodiments, the active growth material itself may have any of the properties described herein with respect to active growth materials and their precursors.

Figure 2:
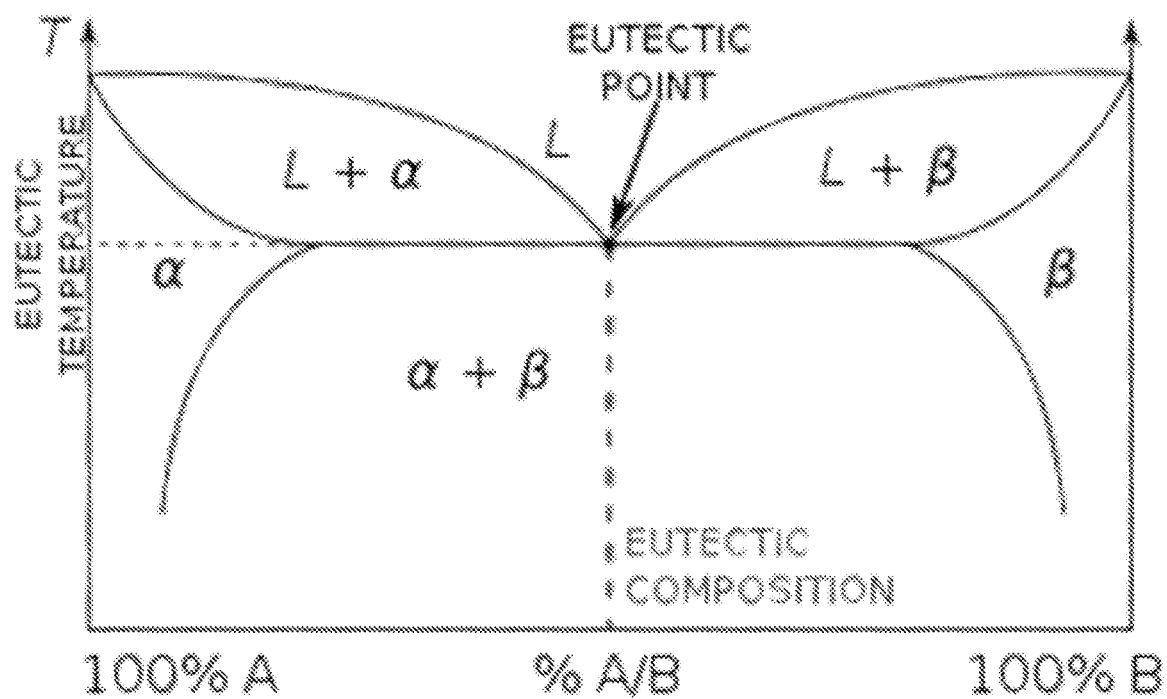
FIG. 2 is a schematic illustration of a phase diagram of two components capable of forming a eutectic composition with each other, according to some embodiments.

As noted above, in some embodiments the active growth material, or a precursor thereof, comprises at least two components that are capable of forming a eutectic composition with each other. FIG. 2 shows a non-limiting schematic of a phase diagram for two components (labeled "A" and "B" in FIG. 2) that are capable of forming a eutectic composition with each other. As would be understood by one of ordinary skill in the art, a eutectic composition is a composition at which a liquid phase is in equilibrium with both a first solid phase and a second solid phase different from the first solid phase at the eutectic temperature. For example, in FIG. 2 the liquid phase at the eutectic composition, the first solid phase α, and the second solid phase β are in equilibrium with each other at the eutectic temperature. A eutectic composition that is cooled from a temperature above the eutectic temperature to a temperature below the eutectic temperature under equilibrium cooling conditions undergoes solidification at the eutectic temperature to form the first solid phase α and the second solid phase β simultaneously from the liquid. As would also be understood by one of ordinary skill in the art, two components that are capable of forming a eutectic composition with each other are typically also able of forming non-eutectic compositions with each other. For example, in FIG. 2 components A and B may be at any composition other than the eutectic composition instead of at the eutectic composition. Non-eutectic compositions often undergo solidification over a range of temperatures because liquid phases may be in equilibrium with solid phases over a range of temperatures. For example, in FIG. 2 the liquid phase and the solid a phase are in equilibrium with each other for compositions that include a relatively larger amount of A than the eutectic composition and that are at a temperature between the eutectic temperature and the melting temperature of A.

Certain active growth materials or precursors thereof that comprise at least two components that are capable of forming a eutectic composition with each other but do not comprise those components in the relative amounts present at the eutectic composition may form a liquid with the eutectic composition upon cooling from a temperature above the eutectic temperature to the eutectic temperature. Using the phase diagram shown in FIG. 2 as an example, a composition that includes relatively more A than the eutectic composition would, upon equilibrium cooling, nucleate solid a (which is enriched in component A in comparison to the composition as a whole) from the single phase liquid when the temperature reaches the liquidus temperature for the composition. As the composition is further cooled, increasing amounts of solid a would be formed and the liquid would become increasingly enriched in B until the eutectic temperature is reached. At the eutectic temperature, the remaining liquid present would be at the eutectic composition and would be in equilibrium with solid phases α and β. Further cooling might result in changes in the compositions of solid phases α and/or β and/or might result in changes in the relative amounts of solid phases α and β that are present.

In some embodiments, an active growth material or a precursor thereof may comprise at least two components that are capable of forming a eutectic composition with each other, and at least a certain percentage of the active growth material may solidify at and/or below the eutectic temperature upon cooling the active growth material a single phase liquid to form two solid phases under equilibrium conditions.

As used herein, equilibrium cooling conditions refer to conditions where diffusion in the liquid and solid phase(s) is sufficiently rapid such that each phase is present in the amount and at the concentration that would be expected based upon the equilibrium phase diagram throughout the cooling process. Thus, when the equilibrium compositions of the liquid and solid phase(s) change during cooling, it can be assumed that the amount and composition of each phase also change correspondingly during cooling. One of ordinary skill in the art would be capable of determining how much of an active growth material would solidify at the eutectic temperature when the active growth material is cooled from a single phase liquid to form two solid phases under equilibrium conditions by using the lever rule to determine the amount of liquid that would be present at the eutectic temperature prior to the formation of any solid phase not present at temperatures above the eutectic temperature. As an example, referring again to FIG. 2 and the A-B alloy it shows, one could use the following equation to determine the fraction of a composition more A-rich than the eutectic composition that would solidify at the eutectic temperature by using the following equation:

$$\text{wt } \%_{sol} = \frac{\text{wt } \%_{B,comp} - \text{wt } \%_{B,\alpha}}{\text{wt } \%_{B,eut} - \text{wt } \%_{B,\alpha}} \times 100\%$$

where wt $\%_{sol}$ is the wt % of the composition that would solidify at the eutectic temperature, wt $\%_{B,comp}$ is the wt % of component B in the composition, wt $\%_{B,\alpha}$ is the wt % of component B in the α phase and wt $\%_{B,eut}$ is the wt % of component B in the eutectic composition.

When the active growth material or precursor thereof comprises at least two components that are capable of forming a eutectic composition with each other, the eutectic temperature may be any suitable value. In some embodiments, the eutectic temperature is greater than or equal to 25° C., greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 450° C., greater than or equal to 500° C., greater than or equal to 550° C., greater than or equal to 600° C., greater than or equal to 650° C., greater than or equal to 700° C., or greater than or equal to 750° C. In some embodiments, the eutectic temperature is less than or equal to 770° C., less than or equal to 750° C., less than or equal to 700° C., less than or equal to 650° C., less than or equal to 600° C., less than or equal to 550° C., less than or equal to 500° C., less than or equal to 450° C., less than or equal to 400° C., less than or equal to 350° C., less than or equal to 300° C., less than or equal to 250° C., less than or equal to 200° C., less than or equal to 150° C., less than or equal to 100° C., or less than or equal to 50° C. Combinations of the above-referenced ranges are also possible (e.g., greater than or equal to 25° C. and less than or equal to 770° C.). Other ranges are also possible.

In some embodiments, a first component and a second component may be present in the active growth material or a precursor thereof in relative amounts such that, were the components heated to form a liquid mixture and subsequently cooled under equilibrium conditions, greater than or equal to 5 wt %, greater than or equal to 10 wt %, greater than or equal to 15 wt %, greater than or equal to 20 wt %, greater than or equal to 25 wt %, greater than or equal to 30 wt %, greater than or equal to 35 wt %, greater than or equal to 40 wt %, greater than or equal to 45 wt %, greater than or equal to 50 wt %, greater than or equal to 55 wt %, greater than or equal to 60 wt %, greater than or equal to 65 wt %, greater than or equal to 70 wt %, greater than or equal to 75 wt %, greater than or equal to 80 wt %, greater than or equal to 85 wt %, greater than or equal to 90 wt %, or greater than or equal to 95 wt % of the active growth material or a precursor thereof would solidify at and/or below the eutectic temperature. In some embodiments, a first component and a second component may be present in the active growth material or a precursor thereof in relative amounts such that, were the components heated to form a liquid mixture and subsequently cooled under equilibrium conditions, less than or equal to 97.5 wt %, less than or equal to 95 wt %, less than or equal to 90 wt %, less than or equal to 85 wt %, less than or equal to 80 wt %, less than or equal to 75 wt %, less than or equal to 70 wt %, less than or equal to 65 wt %, less than or equal to 60 wt %, less than or equal to 55 wt %, less than or equal to 50 wt %, less than or equal to 45 wt %, less than or equal to 40 wt %, less than or equal to 35 wt %, less than or equal to 30 wt %, less than or equal to 25 wt %, less than or equal to 20 wt %, less than or equal to 15 wt %, or less than or equal to 10 wt % of the active growth material or a precursor thereof would solidify at and/or below the eutectic temperature. Combinations of the above-referenced ranges are also possible (e.g. a first component and a second component may be present in the active growth material or a precursor thereof in relative amounts such that, were the components heated to form a liquid mixture and subsequently cooled under equilibrium conditions, greater than or equal to 5 wt % and less than or equal to 95 wt % of the active growth material or precursor thereof would solidify at and/or below the eutectic temperature). Other ranges are also possible. It should be noted that the active growth material need not comprise any specific phases and/or be in thermodynamic equilibrium in order to satisfy the criteria above. For example, the active growth material may satisfy one or more of the criteria above and be a single phase liquid, comprise a liquid and a solid, comprise two solids, comprise a eutectic aggregation, comprise one or more phases that do not have an equilibrium composition, comprise two or more phases present in non-equilibrium amounts, and the like. In certain embodiments, at least a portion of the active growth material is in liquid form during formation of the nanostructures. In some embodiments, at least a portion of the active growth material is in the form of a eutectic aggregation during formation of the nanostructures. In certain embodiments, at least a portion of the active growth material is in a solid that is not a eutectic aggregation during formation of the nanostructures. Combinations of these forms are also possible.

In some embodiments, an active growth material or precursor thereof may comprise at least two components that are capable of forming a eutectic composition with each other and a most abundant component of the active growth material may be within a certain at % of its abundance at a eutectic composition of the active growth material. In some embodiments, the most abundant component of the active growth material may be within 5 at %, within 10 at %, within 15 at %, within 20 at %, within 25 at %, within 30 at %, or within 35 at % of its abundance at a eutectic composition of the active growth material. In some embodiments, the least abundant component of the active growth material may be within 5 at %, within 10 at %, within 15 at %, within 20 at %, within 25 at %, within 30 at %, or within 35 at % of its abundance at a eutectic composition of the active growth material. As used herein, a component of the active growth material (e.g., the most abundant component, the least abundant component) is within a X at % of its abundance at a eutectic composition of the active growth material when the following equation is satisfied:

$$X \text{ at } \% \leq \frac{|(a_{ag} - a_{age})|}{a_{age}} * 100\%$$

where $a_{ag}$ is the abundance of the component in the active growth material and $a_{age}$ is the abundance of the component at the eutectic composition.

In some embodiments, an active growth material or precursor thereof may comprise a eutectic aggregation. As would be known to one of ordinary skill in the art, a eutectic aggregation is a characteristic structure that forms when a material comprising at least two components capable of forming a eutectic composition with each other are cooled through the eutectic temperature such that a liquid present above the eutectic temperature simultaneously solidifies to form both a first solid phase and a second solid phase different from the first solid phase. In some embodiments, at least 5 wt %, greater than or equal to 10 wt %, greater than or equal to 15 wt %, greater than or equal to 20 wt %, greater than or equal to 25 wt %, greater than or equal to 30 wt %, greater than or equal to 35 wt %, greater than or equal to 40 wt %, greater than or equal to 45 wt %, greater than or equal to 50 wt %, greater than or equal to 55 wt %, greater than or equal to 60 wt %, greater than or equal to 65 wt %, greater than or equal to 70 wt %, greater than or equal to 75 wt %, greater than or equal to 80 wt %, greater than or equal to 85 wt %, greater than or equal to 90 wt %, or greater than or equal to 95 wt % of the active growth material or a precursor thereof is made up of a eutectic aggregation. In some embodiments, less than or equal to 100 wt %, less than or equal to 95 wt %, less than or equal to 90 wt %, less than or equal to 85 wt %, less than or equal to 80 wt %, less than or equal to 75 wt %, less than or equal to 70 wt %, less than or equal to 65 wt %, less than or equal to 60 wt %, less than or equal to 55 wt %, less than or equal to 50 wt %, less than or equal to 45 wt %, less than or equal to 40 wt %, less than or equal to 35 wt %, less than or equal to 30 wt %, less than or equal to 25 wt %, less than or equal to 20 wt %, less than or equal to 15 wt %, or less than or equal to 10 wt % of the active growth material or a precursor thereof is made up of a eutectic aggregation. Combinations of the above-referenced ranges are also possible (e.g., greater than or equal to 5 wt % and less than or equal to 100 wt % of the active growth material or precursor thereof is made up of a eutectic aggregation). Other ranges are also possible. The wt % of an active growth material or precursor thereof that is made up of a eutectic aggregation may be determined by electron microscopy and spectroscopy.

As noted above, in some embodiments, the active growth material, or a precursor thereof, comprises at least a first type of cation, a second type of cation different from the first type of cation, and an anion. The first type of cation and the second type of cation may each be an alkali metal cation or an alkaline earth metal cation. In some embodiments, both the first type of cation and the second type of cation are alkali metal cations. According to some embodiments, both the first type of cation and the second type of cation area alkaline earth metal cations. In certain embodiments, the first type of cation is an alkali metal cation and the second type of cation is an alkaline earth metal cation.

The term "alkali metal" is used herein to refer to the following six chemical elements of Group 1 of the periodic table: lithium, sodium, potassium, rubidium, cesium, and francium. Elemental alkali metals are uncharged but are capable of becoming oxidized to form ions with a +1 oxidation state. In accordance with some embodiments, the active growth material, or a precursor thereof, may comprise a first type of cation and/or a second type of cation that is an alkali metal cation. In certain embodiments, the alkali metal in the active growth material, or a precursor thereof, is the cation of a salt. In certain embodiments, the alkali metal or the precursor thereof is not in the form of an oxide. In some embodiments, the alkali metal or the precursor thereof is not in the form of a chalcogenide. In certain embodiments, the alkali metal or the precursor thereof is not in the form of a carbide. In some embodiments, the alkali metal in the active growth material, or a precursor thereof, is a component of an alloy. Other components of active growth materials, or precursors thereof, which contain alkali metals may be one or more of atoms in any oxidation state, polyatomic ions with any charge, and molecules with any molecular weight and charge, in accordance with some embodiments. In certain embodiments, the alkali metal and/or other components of the active growth material, or a precursor thereof, may be in the same oxidation state throughout the processes of active growth material deposition and nanostructure growth. In other embodiments, the alkali metal and/or other components of the active growth material may transition from one oxidation state to another oxidation state during the processes of active growth material deposition and/or nanostructure growth. In accordance with some embodiments, the alkali metal and/or other components of the active growth material may be in the same oxidation state after nano structure growth has been completed as before and/or during nanostructure growth. In accordance with other embodiments, the alkali metal and/or other components of the active growth material may be in a different oxidation state after nanostructure growth has been completed as before and/or during nanostructure growth.

The term "alkaline earth metal" is used herein to refer to the six chemical elements in Group 2 of the periodic table: beryllium, magnesium, calcium, strontium, barium, and radium. Elemental alkaline earth metals are uncharged but are capable of becoming oxidized to form ions with a +1 or +2 oxidation state. In accordance with some embodiments, the active growth material, or a precursor thereof, may comprise a first type of cation and/or a second type of cation that is an alkaline earth metal cation. In certain embodiments, the alkaline earth metal in the active growth material, or a precursor thereof, is the cation of a salt. In certain embodiments, the alkaline earth metal or the precursor thereof is not in the form of an oxide. In some embodiments, the alkaline earth metal or the precursor thereof is not in the form of a chalcogenide. In certain embodiments, the alkaline earth metal or the precursor thereof is not in the form of a carbide. In some embodiments, the alkaline earth metal in the active growth material, or a precursor thereof, is a component of an alloy. Combinations of these are also possible. Other components of active growth materials, or precursors thereof, which contain alkaline earth metals may be one or more of atoms in any oxidation state, polyatomic ions with any charge, and molecules with any molecular weight and charge, in accordance with some embodiments. In certain embodiments, the alkaline earth metal and/or other components of the active growth material, or a precursor thereof, may be in the same oxidation state throughout the processes of active growth material deposition and nanostructure growth. In other embodiments, the alkaline earth metal and/or other components of the active growth material may transition from one oxidation state to another oxidation state during the processes of active growth material deposition and/or nanostructure growth. In accordance with some embodiments, the alkaline earth metal and/or other components of the active growth material may be in the same oxidation state after nanostructure growth has been completed as before and/or during nanostructure growth. In accordance with other embodiments, the alkaline earth metal and/or other components of the active growth material may be in a different oxidation state after nanostructure growth has been completed as before and/or during nanostructure growth.

In certain embodiments, the active growth material, or a precursor thereof, comprises a first type of cation that is a lithium cation. In some embodiments, the active growth material, or a precursor thereof, comprises a second type of cation that is a potassium cation. In some embodiments, the active growth material, or a precursor thereof, comprises a first type of cation that is a lithium cation and a second type of cation that is a potassium cation.

In certain embodiments, the active growth material, or a precursor thereof, comprises an anion that is a halide anion. The term "halide anion" is used herein to refer to negatively charged ions of following five chemical elements of Group 17 of the periodic table: fluorine, chlorine, bromine, iodine, and astatine. In some embodiments, the active growth material or precursor thereof may contain only halide anions; in other embodiments, active growth material or precursor thereof may additionally contain other anions. The additional anions in such an active growth material or precursor thereof may have any negative oxidation state, may be monatomic or polyatomic, may have any molecular weight, and may be organic ions or inorganic ions. In accordance with certain embodiments, the active growth material or precursor thereof may additionally comprise cations which are neither alkali metals nor alkaline earth metals. These cations may have any positive oxidation state, may be monatomic or polyatomic, may have any molecular weight, and may be organic ions or inorganic ions. The ratio of halide anions to the alkaline earth metal(s) and/or alkali metal(s) in the active growth material or precursor thereof generally depends upon the oxidation states of these metals, the oxidation states of the other cations and/or anions within the salt, and the overall ratios of each of the other ions to each other. The halide salt may further comprise bound water in some embodiments. In other embodiments, the active growth material or precursor thereof may be water free.

According to certain embodiments, the halide anions make up at least a certain percentage of the total number of anions within the active growth material or precursor thereof. In some embodiments, the halide anions make up at least 50%, at least 75%, at least 90%, at least 95%, or at least 99% of the total number of anions within the active growth material or precursor thereof. In certain embodiments, the halide anions make up less than or equal to 100%, less than 99%, less than 95%, less than 90%, or less than 75% of the total number of anions within the active growth material or precursor thereof. Combinations of the above-referenced ranges are also possible (e.g., greater than or equal to 95% and less than or equal to 100% of the total number of anions within the active growth material or precursor thereof). Other ranges are also possible.

In certain embodiments, the active growth material, or a precursor thereof, comprises at least one of a chloride anion. In some embodiments, the active growth material or precursor thereof may contain only chloride anions; in other embodiments, the active growth material or precursor thereof may additionally contain other anions. The additional anions in such an active growth material or precursor thereof may have any negative oxidation state, may be monatomic or polyatomic, may have any molecular weight, and may be organic ions or inorganic ions. In accordance with certain embodiments, the active growth material or precursor thereof may additionally comprise cations which are neither alkali metals nor alkaline earth metals. These cations may have any positive oxidation state, may be monatomic or polyatomic, may have any molecular weight, and may be organic ions or inorganic ions. The ratio of chloride anions to the alkaline earth metal(s) and/or alkali metal(s) in the active growth material or precursor thereof generally depends upon the oxidation states of these metals, the oxidation states of the other cations and/or anions within the active growth material or precursor thereof, and the overall ratios of each of the other ions to each other. The active growth material or precursor thereof may further comprise bound water in some embodiments. In other embodiments, the active growth material or precursor thereof may be water free.

According to certain embodiments, the chloride anions make up at least a certain percentage of the total number of anions within the active growth material or precursor thereof. In some embodiments, the chloride anions make up at least 50%, at least 75%, at least 90%, at least 95%, or at least 99% of the total number of anions within the active growth material or precursor thereof. In certain embodiments, the chloride anions make up less than or equal to 100%, less than 99%, less than 95%, less than 90%, or less than 75% of the total number of anions within the active growth material or precursor thereof. Combinations of the above-referenced ranges are also possible (e.g., greater than or equal to 95% and less than or equal to 100% of the total number of anions within the active growth material or precursor thereof). Other ranges are also possible.

The anion(s) may have any chemical structure and any negative oxidation state, in accordance with certain embodiments. In some embodiments, one or more anions may be monatomic or polyatomic. The anions may be organic or inorganic, in some embodiments. Each anion may have the same chemical formula or different anions may have different coordination numbers, in accordance with certain embodiments. According to certain embodiments, the anions may have coordination numbers ranging from 4 to 12. Each anion may have the same coordination number or the anions may comprise ions of differing coordination numbers.

In some embodiments, active growth materials (or active growth material precursors) may include lithium cations, potassium cations, and chloride anions. In some embodiments, the lithium cations, potassium cations, and chloride anions may together make up greater than or equal to 5 wt %, greater than or equal to 10 wt %, greater than or equal to 15 wt %, greater than or equal to 20 wt %, greater than or equal to 25 wt %, greater than or equal to 30 wt %, greater than or equal to 35 wt %, greater than or equal to 40 wt %, greater than or equal to 45 wt %, greater than or equal to 50 wt %, greater than or equal to 55 wt %, greater than or equal to 60 wt %, greater than or equal to 65 wt %, greater than or equal to 70 wt %, greater than or equal to 75 wt %, greater than or equal to 80 wt %, greater than or equal to 85 wt %, greater than or equal to 90 wt %, or greater than or equal to 95 wt % of the active growth material or a precursor thereof. In some embodiments, the lithium cations, potassium cations, and chloride anions may together make up less than or equal to 100 wt %, less than or equal to 95 wt %, less than or equal to 90 wt %, less than or equal to 85 wt %, less than or equal to 80 wt %, less than or equal to 75 wt %, less than or equal to 70 wt %, less than or equal to 65 wt %, less than or equal to 60 wt %, less than or equal to 55 wt %, less than or equal to 50 wt %, less than or equal to 45 wt %, less than or equal to 40 wt %, less than or equal to 35 wt %, less than or equal to 30 wt %, less than or equal to 25 wt %, less than or equal to 20 wt %, less than or equal to 15 wt %, or less than or equal to 10 wt % of the active growth material or a precursor thereof. Combinations of the above-referenced ranges are also possible (e.g., greater than or equal to 5 wt % and less than or equal to 100 wt % of the active growth material or a precursor thereof). Other ranges are also possible.

In some embodiments, the active growth material or precursor thereof comprises a lithium-potassium-chloride alloy, or an alloy with the composition $Li_xK_yCl_z$ where each of x, y, and z are non-zero and positive. Certain lithium-potassium-chloride alloys have relatively low melting points (e.g., less than or equal to 450° C., less than or equal to 400° C., or 385° C. for $Li_{0.59}K_{0.41}Cl_1$) and/or may be relatively easy to remove from carbon-based nanostructures after growth (e.g., by vaporization). In some cases, lithium-potassium-chloride alloys may comprise a chlorine radical when in the liquid phase, which may facilitate electron transfer during carbon-based nanostructure growth (e.g., during chemical vapor deposition processes). In some embodiments the active growth material or precursor thereof may have the composition $Li_xK_yCl_z$ and x and y may sum to z. In some embodiments, x is 0.59, y is 0.41, and z is 1.

In certain embodiments, the active growth material or precursor thereof comprises an alloy with the composition $Li_xK_yCl_z$ where each of x, y, and z are non-zero and positive and x is greater than or equal to 0.05, greater than or equal to 0.1, greater than or equal to 0.15, greater than or equal to 0.2, greater than or equal to 0.25, greater than or equal to 0.3, greater than or equal to 0.35, greater than or equal to 0.4, greater than or equal to 0.45, greater than or equal to 0.5, greater than or equal to 0.55, greater than or equal to 0.6, greater than or equal to 0.65, greater than or equal to 0.7, greater than or equal to 0.75, greater than or equal to 0.8, greater than or equal to 0.85, or greater than or equal to 0.9. In some embodiments, x is less than or equal to 0.95, less than or equal to 0.9, less than or equal to 0.85, less than or equal to 0.8, less than or equal to 0.75, less than or equal to 0.7, less than or equal to 0.65, less than or equal to 0.6, less than or equal to 0.55, less than or equal to 0.5, less than or equal to 0.45, less than or equal to 0.4, less than or equal to 0.35, less than or equal to 0.3, less than or equal to 0.25, less than or equal to 0.2, less than or equal to 0.15, or less than or equal to 0.1. Combinations of the above-referenced ranges are also possible (e.g., greater than or equal to 0.55 and less than or equal to 0.6, or greater than or equal to 0.05 and less than or equal to 0.95). Other ranges are also possible. In some embodiments, x may have any of the values above, x and y may sum to 1, and z may be 1.

In certain embodiments, the active growth material or precursor thereof comprises an alloy with the composition $Li_xK_yCl_z$ where each of x, y, and z are non-zero and positive and y is greater than or equal to 0.05, greater than or equal to 0.1, greater than or equal to 0.15, greater than or equal to 0.2, greater than or equal to 0.25, greater than or equal to 0.3, greater than or equal to 0.35, greater than or equal to 0.4, greater than or equal to 0.45, greater than or equal to 0.5, greater than or equal to 0.55, greater than or equal to 0.6, greater than or equal to 0.65, greater than or equal to 0.7, greater than or equal to 0.75, greater than or equal to 0.8, greater than or equal to 0.85, or greater than or equal to 0.9. In some embodiments, y is less than or equal to 0.95, less than or equal to 0.9, less than or equal to 0.85, less than or equal to 0.8, less than or equal to 0.75, less than or equal to 0.7, less than or equal to 0.65, less than or equal to 0.6, less than or equal to 0.55, less than or equal to 0.5, less than or equal to 0.45, less than or equal to 0.4, less than or equal to 0.45, 0.35, less than or equal to 0.3, less than or equal to 0.25, less than or equal to 0.2, less than or equal to 0.15, or less than or equal to 0.1. Combinations of the above-referenced ranges are also possible (e.g., greater than or equal to 0.4 and less than or equal to 0.45, or greater than or equal to 0.05 and less than or equal to 0.95). Other ranges are also possible. In some embodiments, y may have any of the values above, x and y may sum to 1, and z may be 1.

According to certain embodiments, at least 5% of the carbon-based nanostructures that are grown are in direct contact with at least one of the first type of cation, the second type of cation, and the anion (e.g., during the growth process and/or immediately following the growth process). In certain embodiments, at least 10%, at least 20%, at least 30%, at least 40%, at least 50%, at least 60%, at least 70%, at least 80%, at least 90%, at least 95%, at least 99%, or all of the carbon-based nanostructures that are grown are in direct contact with at least one of the first type of cation, the second type of cation, and the anion (e.g., during the growth process or immediately following the growth process). The carbon-based nanostructure can contact the first type of cation, the second type of cation, and/or the anion in a manner such that the first type of cation, the second type of cation, and/or the anion is located between the carbon-based nanostructures and an optional substrate, in some embodiments. In some embodiments, the carbon-based nanostructures can contact the first type of cation, the second type of cation, and/or the anion in a manner such that the carbon-based nanostructure is in between the first type of cation, the second type of cation, and/or the anion and an optional substrate.

Generally, materials which are in direct contact with each other are directly adjacent to each other with no intervening material.

In some embodiments, the growth of at least 5% of the carbon-based nanostructures is activated by at least one of the first type of cation, the second type of cation, and the anion. In certain embodiments, the growth of at least 10%, at least 20%, at least 30%, at least 40%, at least 50%, at least 60%, at least 70%, at least 75%, at least 90%, at least 95%, or at least 99% of the carbon-based nanostructures is activated by at least one of the first type of cation, the second type of cation, and the anion. According to certain embodiments, the growth of 100% of the carbon-based nanostructures is activated by at least one of the first type of cation, the second type of cation, and the anion. In certain embodiments, activation comprises reducing the energy barrier between the state of the carbon atoms of the precursor prior to incorporation into the carbon-based nanostructure and the state of the carbon atoms of the precursor after incorporation into the carbon-based nanostructure. Activation can comprise a substantial acceleration of the rate of growth in certain embodiments. In some embodiments, activation can cause growth to occur under conditions where growth would not occur or be significantly retarded in the absence of activation. One of ordinary skill in the art would be capable of determining the effect of the presence of a particular material on the activity of carbon-based nanostructure growth by, for example, determining the number of carbon-based nanostructures grown in the presence of the particular material, determining the number of carbon-based nanostructures grown in the absence of the particular material but under otherwise essentially identical conditions, and comparing the two amounts.

Certain, but not necessarily all, of the active growth materials described herein may possess advantages compared to other materials. For example, the active growth materials described herein can be capable of promoting nanostructure growth on challenging substrates, such as polymers, carbon, metals, and ceramics. As one example, active growth materials described herein can, according to certain embodiments, promote nanostructure growth on sized carbon fiber substrates. The active growth materials described herein may also be resistant to oxide formation, in some embodiments. The active growth materials described herein may promote growth at low temperatures, according to certain embodiments.

In some embodiments, the active growth material, or a precursor thereof, is deposited on an optional growth substrate from a liquid containing active growth material (or active material precursor) particles. Not wishing to be bound by any particular theory, the manner in which the active growth material, or a precursor thereof, leaves the liquid and is deposited onto the substrate might enhance the activity of the active growth material towards carbon nanostructure growth. For example, in some cases, an enhancement in active growth material activity might occur due to clustering of a relatively large number of active growth material (or active growth material precursor) particles. In some instances, an enhancement in active growth material activity might arise due to a change in surface morphology of one or more active growth material particles and/or due to a doping effect resulting from co-deposition of active growth material particles and dopants from the liquid.

In some embodiments, the active growth material, or a precursor thereof, may be deposited on an optional growth substrate by a vapor deposition process. For instance, the active growth material, or a precursor thereof, may be deposited by one or more of sputtering and/or evaporative deposition. In some embodiments, a vapor deposition process may be followed by one or more additional processes to form nanoparticles. The additional processes may include at least one or both of application of heat to the active growth material or precursor thereof and/or exposure of the active growth material or a precursor thereof to a chemical.

A plurality of active growth material particles, or particles of active growth material precursor, can be organized into a monolayer or multilayer film, in some instances. A monolayer or multilayer film might be prepared, for example, using the Langmuir-Schaffer or Langmuir-Blodgett methods. As a specific example, prefabricated nanoparticles can be dispersed in a carrier fluid (e.g., toluene), which can then be transferred (e.g., via a pipette) as a thin layer onto another layer of fluid (e.g., water). The carrier fluid can then be evaporated away leaving behind a film of nanoparticles. The film can then be transferred onto a substrate and used to grow carbon-based nanostructures.

In some cases, the active growth material, or a precursor thereof, may comprise at least one (e.g., a plurality of) nanoscale features. As used herein, a "nanoscale feature" refers to a feature, such as a protrusion, groove or indentation, particle, or other measurable geometric feature on an article that has at least one cross-sectional dimension of less than 1 micron. In some cases, the nanoscale feature may have at least one cross-sectional dimension of less than 500 nm, less than 250 nm, less than 100 nm, less than 10 nm, less than 5 nm, less than 3 nm, less than 2 nm, less than 1 nm, between 0.3 and 10 nm, between 10 nm and 100 nm, or between 100 nm and 1 micron. Not wishing to be bound by any theory, the nanoscale feature may increase the rate at which a reaction, nucleation step, or other process involved in the formation of a nanostructure occurs. Nanoscale features can be formed, for example, by roughening the surface of an active growth material, or a precursor thereof.

The active growth material, or a precursor thereof, can comprise one particle or can comprise multiple particles. Any active growth material particles (or precursor particles) can have any size. In some embodiments, one or more active growth material particles (or precursor particles) has nanoscale dimensions for one or more of their length, width, and depth. Active growth material particles (or active growth material precursor particles) can be nanoparticles, nanowires, and/or thin films. In some instances, the active growth material, or a precursor thereof, may comprise nanoparticles. Generally, the term "nanoparticle" is used to refer to any particle having a maximum cross-sectional dimension of less than 1 micron. In some embodiments, an active growth material nanoparticle or active growth material precursor nanoparticle may have a maximum cross-sectional dimension of less than 500 nm, less than 250 nm, less than 100 nm, less than 10 nm, less than 5 nm, less than 3 nm, less than 2 nm, less than 1 nm, between 0.3 and 10 nm, between 10 nm and 100 nm, or between 100 nm and 1 micron. A plurality of active growth material nanoparticles or active growth material precursor nanoparticles may, in some cases, have an average maximum cross-sectional dimension of less than 1 micron, less than 100 nm, less than 10 nm, less than 5 nm, less than 3 nm, less than 2 nm, less than 1 nm, between 0.3 and 10 nm, between 10 nm and 100 nm, or between 100 nm and 1 micron. As used herein, the "maximum cross-sectional dimension" refers to the largest distance between two opposed boundaries of an individual structure that may be measured. The "average maximum cross-sectional dimension" of a plurality of structures refers to the number average. In accordance with certain embodiments, one or more active growth material particles or active growth material precursor particles can have micrometer or larger dimensions for one or more of their length, width, and depth.

The active growth material, or a precursor thereof, may have any shape. Non-limiting examples of acceptable shapes include spheres, cylinders, cubes, and parallelepipeds. In certain embodiments, the active growth material, or a precursor thereof, may be faceted. The active growth material, or a precursor thereof, may have morphologies with low or no symmetry in some embodiments. Active growth materials or active growth material precursors which form nanowires may have cross-sectionals that are circular, triangular, square, rectangular, pentagonal, hexagonal, heptagonal, octagonal, etc. In other embodiments, active growth materials or active growth material precursors which form nanowires may have cross-sections that have low or no symmetry. In certain embodiments in which active growth material particles or active growth material precursor particles are used, all of the active growth material particles or active growth material precursor particles may have the same or substantially similar morphologies. In other embodiments, the active growth material particles or active growth material precursor particles may comprise different or substantially different morphologies. In some instances, the active growth material, or a precursor thereof, may be deposited on an optional growth substrate in a pattern (e.g., lines, dots, or any other suitable form).

In some instances in which the active growth material (or precursor thereof) is in particulate form, the particles may be substantially the same shape and/or size ("monodisperse"). For example, the particles may have a distribution of dimensions such that the standard deviation of the maximum cross-sectional dimensions of the particles is no more than 50%, no more than 25%, no more than 10%, no more than 5%, no more than 2%, or no more than 1% of the average maximum cross-sectional dimensions of the particles. Standard deviation (lower-case sigma) is given its normal meaning in the art, and may be calculated as:

$$\sigma = \sqrt{\frac{\sum_{i=1}^{n}(D_i - D_{avg})^2}{n-1}}$$

wherein $D_i$ is the maximum cross-sectional dimension of particle i, $D_{avg}$ is the average of the cross-sectional dimensions of the particles, and n is the number of particles. The percentage comparisons between the standard deviation and the average maximum cross-sectional dimensions of the particles outlined above can be obtained by dividing the standard deviation by the average and multiplying by 100%.

The active growth material, or a precursor thereof, may have any atomic arrangement. In some embodiments, the active growth material, or a precursor thereof, may comprise particles or other forms which are single crystalline, polycrystalline, and/or amorphous. In certain embodiments, each particle of active growth material or active growth material precursor has the same atomic structure. In other embodiments, different particles of active growth material or active growth material precursor may have different atomic structures.

In some cases, the active growth material, or a precursor thereof, is in contact with a portion of a growth substrate comprising a material that is different from the material from which the active growth material, or a precursor thereof, is made (e.g., the portion of the active growth material, or a precursor thereof, in contact with the growth substrate). In some cases the active growth material, or a precursor thereof, is in contact with a portion of a growth substrate comprising a material that is the same as the material from which the active growth material, or a precursor thereof, is made (e.g., the portion of the active growth material, or a precursor thereof, in contact with the growth substrate).

As noted above, carbon-based nanostructures can be grown by exposing the active growth material to one or more precursors of the carbon-based nanostructures. The precursor(s) can, according to certain embodiments, participate in a chemical reaction in which carbon dissociates from the precursor and forms new covalent bonds to grow the carbon-based nanostructures.

According to some embodiments, the nanostructure precursor is present in the gas phase prior to being incorporated into the carbon-based nanostructure. For example, according to certain embodiments, gaseous acetylene and/or carbon dioxide can be used as carbon-based nanostructure precursors. The precursor of the carbon-based nanostructures need not necessarily be in the gaseous phase, however, and in certain embodiments, the precursor is in the solid and/or liquid phase (in addition to, or in place of, a gas phase precursor). In certain embodiments that comprise more than one precursor, each precursor may be in one or more phases. Different precursors may be in the same phase(s) or may be in different phases.

According to some embodiments, the precursor comprises carbon dioxide ($CO_2$). The carbon dioxide in the precursor can be in any state of matter, including solid, liquid, and/or gas. In certain, although not necessarily all, embodiments, a gaseous carbon dioxide precursor is used. The carbon dioxide can be in more than one of these forms, e.g., when the reaction conditions comprise a temperature and pressure when more than one phase of carbon dioxide is stable. In some embodiments, carbon dioxide is the only precursor present. In other embodiments, carbon dioxide is one of two or more precursors to which the active growth material is exposed. Without wishing to be bound by any particular theory, it has been observed that the use of carbon dioxide precursors can allow one to grow carbon-based nanostructures (e.g., carbon nanotubes) at relatively low temperatures, compared to the temperatures at which carbon-based nanostructures can be grown in the absence of the carbon dioxide but under otherwise essentially identical conditions.

According to some embodiments, the precursor comprises at least one of a hydrocarbon and an alcohol. In certain embodiments, the precursor may contain one or more hydrocarbons but no alcohols. In other embodiments, the precursor may contain one or more alcohols but no hydrocarbons. In yet other embodiments, the precursor may contain both one or more hydrocarbons and one or more alcohols. In some such embodiments, the hydrocarbon(s) and/or alcohol(s) are the only precursors present. In other embodiments, the precursor further comprises additional molecules. For example, in some embodiments, the precursor comprises carbon dioxide in addition to a hydrocarbon and/or an alcohol. In one particular set of embodiments, the precursor comprises at least one alkyne (e.g., acetylene) and carbon dioxide.

The term "hydrocarbon" is used herein to describe organic compounds consisting only of hydrogen and carbon. A hydrocarbon may be saturated or unsaturated (at one or more locations) and may have a linear, branched, monocyclic, or polycyclic structure. A hydrocarbon may be aliphatic or aromatic, and may contain one or more alkyl, alkene, and/or alkyne functional groups. In certain embodiments, the hydrocarbon is an alkane. In some embodiments, the hydrocarbon is an alkene. In certain embodiments, the hydrocarbon is an alkyne. In some embodiments, the hydrocarbon is a $C_1$-$C_{10}$ hydrocarbon, such as a $C_1$-$C_8$ hydrocarbon, a $C_1$-$C_6$ hydrocarbon, or a $C_1$-$C_4$ hydrocarbon. For example, in some embodiments, the hydrocarbon is a $C_1$-$C_{10}$ alkyne, a $C_1$-$C_8$ alkyne, a $C_1$-$C_6$ alkyne, or a $C_1$-$C_4$ alkyne. In some embodiments, the hydrocarbon is a $C_1$-$C_{10}$ alkane, a $C_1$-$C_8$ alkane, a $C_1$-$C_6$ alkane, or a $C_1$-$C_4$ alkane. In certain embodiments, the hydrocarbon is a $C_1$-$C_{10}$ alkene, a $C_1$-$C_8$ alkene, a $C_1$-$C_6$ alkene, or a $C_1$-$C_4$ alkene. The hydrocarbon may have any molecular weight. Non-limiting examples of suitable hydrocarbons include methane ($CH_4$), ethylene ($C_2H_4$), and acetylene ($C_2H_2$). In certain but not necessarily all embodiments, the hydrocarbon comprises acetylene.

As used herein, the term "alcohol" refers to a molecule with at least one hydroxyl (—OH) functional group. Non-limiting examples of alcohols include methanol, ethanol, (iso)propanol, and butanol. Alcohols may be saturated or unsaturated (at one or more locations) and may have a linear, branched, monocyclic, or polycyclic structure. Alcohols may be aliphatic or aromatic, and may contain one or more alkyl, alkene, and/or alkyne functional groups. In certain but not necessarily all embodiments, alcohols may comprise more than one —OH functional group. In some embodiments, the alcohol is a $C_1$-$C_{10}$ alcohol, such as a $C_1$-$C_8$ alcohol, a $C_1$-$C_6$ alcohol, or a $C_1$-$C_4$ alcohol.

In some embodiments, at least 50% of the nanostructure precursor is made up of a combination of hydrocarbons, alcohols, and carbon dioxide. In certain embodiments, at least 60 wt %, at least 70 wt %, at least 80 wt %, at least 90 wt %, at least 95 wt %, at least 99 wt %, or all of the nanostructure precursor is made up of a combination of hydrocarbons, alcohols, and carbon dioxide. In certain embodiments, at least 50 wt %, at least 60 wt %, at least 70 wt %, at least 80 wt %, at least 90 wt %, at least 95 wt %, at least 99 wt %, or all of the nanostructure precursor is made up of a combination of hydrocarbons and carbon dioxide. In certain embodiments, at least 60 wt %, at least 70 wt %, at least 80 wt %, at least 90 wt %, at least 95 wt %, at least 99 wt %, or all of the nanostructure precursor is made up of a combination of alkynes (e.g., $C_1$-$C_{10}$, $C_1$-$C_8$, $C_1$-$C_6$, or $C_1$-$C_4$ alkynes) and carbon dioxide. In certain embodiments, at least 60 wt %, at least 70 wt %, at least 80 wt %, at least 90 wt %, at least 95 wt %, at least 99 wt %, or all of the nanostructure precursor is made up of a combination of acetylene and carbon dioxide. Other ranges are also possible.

As noted above, the nano structure precursor material can be in any suitable phase. In one set of embodiments, the nanostructure precursor material comprises a solid. Examples of solid precursor materials include, for example, coal, coke, amorphous carbon, unpyrolyzed organic polymers (e.g., phenol-formaldehyde, resorcinol-formaldehyde, melamine-formaldehyde, etc.), partially pyrolyzed organic polymers, diamond, graphene, graphite, or any other suitable solid form of carbon. In some embodiments, the solid precursor material may contain carbon in an amount of at least 25 wt %, at least 50 wt %, at least 75 wt %, at least 85 wt %, at least 90 wt %, at least 95 wt %, at least 98 wt %, or at least 99 wt %.

In one set of embodiments, the nanostructure precursor material comprises both a solid and a non-solid (e.g., a liquid, a gas, etc.). For example, the nanostructure precursor material can comprise a solid form of carbon placed close to or in contact with the active growth material and a vapor-phase precursor material. As a specific example, the solid precursor component can be deposited on or near the active growth material as soot, amorphous carbon, graphene, or graphite, and the active growth material can be exposed to vapor comprising a hydrocarbon (e.g., methane, ethylene, acetylene, and the like). Not wishing to be bound by any particular theory, under some growth conditions, the presence of the solid precursor material can allow for nanostructure growth that might not occur in the absence of the solid precursor material. In some cases, the solid precursor material might provide a base from which the non-solid nanostructure precursor material can be added to grow the carbon-based nanostructure. For example, in some embodiments, a small portion of a carbon nanotube can be used as a starting material from which a larger nanotube can be grown using non-solid carbon nanostructure precursor material.

As noted above, certain embodiments comprise exposing the nanostructure precursor and the active growth material to a set of conditions that causes growth of carbon-based nanostructures on the active growth material. In some cases, the set of conditions may facilitate nucleation of carbon-based nanostructures during the growth process. According to certain embodiments, carbon-based nanostructures can be grown at relatively low temperatures. The ability to grow carbon-based nanostructures at relatively low temperatures can be advantageous, according to certain but not necessarily all embodiments, as the use of low temperatures can reduce the amount of energy needed to perform the growth process. According to some embodiments, the active growth material is at a temperature of less than or equal to 1200° C., less than or equal to 1100° C., less than or equal to 1000° C., less than or equal to 900° C., less than or equal to 800° C., less than or equal to 720° C., less than or equal to 700° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the active growth material during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 450° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible.

In some embodiments, the precursor of the carbon-based nanostructures is at a temperature of less than or equal to 1200° C., less than or equal to 1100° C., less than or equal to 1000° C., less than or equal to 900° C., less than or equal to 800° C., less than or equal to 720° C., less than or equal to 700° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the precursor of the carbon-based nanostructures during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 450° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible. In some embodiments, the precursor of the carbon-based nanostructures is at a temperature outside the ranges listed above during the growth of the carbon-based nanostructures.

In certain embodiments, the substrate (when present) is at a temperature of less than or equal to 1200° C., less than or equal to 1100° C., less than or equal to 1000° C., less than or equal to 900° C., less than or equal to 800° C., less than or equal to 720° C., less than or equal to 700° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the substrate (when present) during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible.

According to certain embodiments, carbon-based nanostructure growth can occur within a vessel within which the temperature of the enclosed space is less than or equal to 1200° C., less than or equal to 1100° C., less than or equal to 1000° C., less than or equal to 900° C., less than or equal to 800° C., less than or equal to 720° C., less than or equal to 700° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the enclosed space during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 450° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible.

In certain embodiments, two or more of the active growth material, the substrate (when present), the precursor, and the vessel (when present) are at the same temperature. According to some embodiments, none of the active growth material, substrate, precursor, and vessel are at the same temperature. The temperature of any one or more components is higher or lower before and/or after growth for any period of time, in some embodiments.

In some cases, a source of external energy may be coupled with the growth apparatus to provide energy to cause the growth sites to reach the necessary temperature for growth. The source of external energy may provide thermal energy, for example, by resistively heating a wire coil in proximity to the growth sites (e.g., active growth material) or by passing a current through a conductive growth substrate. In some cases, the source of external energy may provide an electric and/or magnetic field to the substrate. In some cases, the source of external energy may be provided via magnetron heating, via laser, or via direct, resistive heating the growth substrate, or a combination of one or more of these. The source of external energy may be provided as a component of a closed loop temperature control system in some embodiments. It may be provided as part of an open loop temperature control system in some embodiments. In an illustrative embodiment, the set of conditions may comprise the temperature of the active growth material surface, the chemical composition of the atmosphere surrounding the active growth material, the flow and pressure of reactant gas(es) (e.g., nanostructure precursors) surrounding the active growth material surface and within the surrounding atmosphere, the deposition or removal of active growth materials or active growth material precursors, or other materials, on the surface of the substrate (when present), and/or optionally the rate of motion of the substrate. In some cases, the source of external energy may provide X-rays to the growth substrate (when present) and/or active growth material. Not wishing to be bound by any particular theory, the X-rays might induce oxygen deficiency into the active growth material, might activate the active growth material, and/or it might change the gas species coming into contact with the active growth material.

According to certain embodiments, exposure of the precursor of the carbon-based nanostructures to the active growth material may occur at a particular temperature, pH, solvent, chemical reagent, type of atmosphere (e.g., nitrogen, argon, oxygen, etc.), electromagnetic radiation, or the like. In some cases, the set of conditions under which the precursor of the carbon-based nanostructures is exposed to the active growth material may be selected to facilitate nucleation, growth, stabilization, removal, and/or other processing of nanostructures. In some cases, the set of conditions may be selected to facilitate reactivation, removal, and/or replacement of the active growth material. In some cases, the set of conditions may be selected to maintain the activity of the active growth material. Some embodiments may comprise a set of conditions comprising exposure to a source of external energy. The source of energy may comprise electromagnetic radiation, electrical energy, sound energy, thermal energy, or chemical energy. For example, the set of conditions comprises exposure to heat or electromagnetic radiation, resistive heating, exposure to a laser, or exposure to infrared light. In some embodiments, the set of conditions comprises exposure to a particular temperature, pressure, chemical species, and/or nanostructure precursor material.

According to certain embodiments, the growth of the carbon-based nanostructures from the precursors can occur under conditions which are selected such that carbon nanotubes are selectively produced. In many cases, conditions (e.g., temperature, pressure, etc.) that lead to the production of other carbon-based nanostructures, such as graphene, cannot be successfully used to produce nanotubes. In some cases, carbon nanotubes will not grow on traditional active growth materials from which graphene will grow.

The growth of the carbon-based nanostructures can occur, in accordance with certain embodiments, under a gaseous atmosphere. The atmosphere can comprise the precursor and, optionally, one or more carrier gases which are not consumed during carbon-based nanostructure growth. Examples of suitable carrier gases include, but are not limited to, helium, argon, and nitrogen.

In certain embodiments in which carbon dioxide and at least one hydrocarbon (e.g., at least one alkyne) are used in the precursor of the carbon-based nanostructures, the molar ratio of carbon dioxide to the hydrocarbons (e.g., alkynes) is at least 0:1, at least 0.01:1, at least 0.05:1, at least 0.1:1; at least 0.2:1, at least 0.5:1, at least 1:1, or at least 2:1 (and/or, in certain embodiments, up to 0.01:1, up to 0.05:1, up to 0.1:1, up to 0.2:1, up to 0.5:1, up to 1:1, up to 2:1, up to 10:1, up to 13:1, up to 15:1, up to 20:1, up to 100:1, or more). For example, in some embodiments in which carbon dioxide and acetylene ($C_2H_2$) are used in the precursor of the carbon-based nanostructures, the molar ratio of carbon dioxide to acetylene is at least 0.01:1, at least 0.05:1, at least 0.1:1; at least 0.2:1, at least 0.5:1, at least 1:1, or at least 2:1 (and/or, in certain embodiments, up to 10:1, up to 13:1, up to 15:1, up to 20:1, up to 100:1, or more).

In some cases, exposure occurs at pressures comprising substantially atmospheric pressure (i.e., about 1 atm or 760 torr). In some cases, exposure occurs at a pressure of less than 1 atm (e.g., less than 100 torr, less than 10 torr, less than 1 torr, less than 0.1 torr, less than 0.01 torr, or lower). In some cases, the use of high pressure may be advantageous. For example, in some embodiments, exposure to a set of conditions comprises exposure at a pressure of at least 2 atm, at least 5 atm, at least 10 atm, at least 25 atm, or at least 50 atm.

Introduction of gases to a gaseous atmosphere can occur at any suitable rate. In some embodiments, any gas present during the reaction may be introduced to the gaseous atmosphere at a rate greater than or equal to 0.01 sccm, greater than or equal to 0.1 sccm, greater than or equal to 1 sccm, greater than or equal to 5 sccm, greater than or equal to 10 sccm, greater than or equal to 25 sccm, greater than or equal to 50 sccm, greater than or equal to 100 sccm, greater than or equal to 150 sccm, greater than or equal to 500 sccm, or greater than or equal to 1000 sccm. Any gas present during the reaction may be introduced to the gaseous atmosphere at a rate less than or equal to 1500 sccm, less than or equal to 1000 sccm, less than or equal to 500 sccm, less than or equal to 150 sccm, less than or equal to 100 sccm, less than or equal to 50 sccm, less than or equal to 25 sccm, less than or equal to 10 sccm, less than or equal to 5 sccm, less than or equal to 1 sccm, less than or equal to 0.1 sccm. Combinations of the above-referenced ranges are also possible (e.g., greater than or equal to 10 sccm and less than or equal to 25 sccm). Other ranges are also possible. If more than one gas is introduced, the gases may be introduced at the same rate or they may be introduced at different rates. Gases may be introduced at the same time or at different times. The gases may be introduced in any order (e.g., the precursor may be introduced prior to the introduction of any other gas, may be introduced after all other gases have been introduced, or may be introduced before some gases but after others).

The carbon-based nanostructures may grow from the precursor at any suitable rate. In some embodiments, the carbon-based nanostructures may grow from the precursor such that lengths of carbon-based nanostructures increase at a rate of greater than or equal to 0.1 microns per minute, greater than or equal to 0.25 microns per minute, greater than or equal to 0.5 microns per minute, greater than or equal to 1 micron per minute, greater than or equal to 2.5 microns per minute, or greater than or equal to 5 microns per minute. In some embodiments, the carbon-based nanostructures may grow from the precursor such that lengths of carbon-based nanostructures increase at a rate of up to 10 microns per minute, up to 50 microns per minute, up to 100 microns per minute, or more. Combinations of the above-referenced ranges are also possible (e.g., greater than or equal to 0.1 microns per minute and up to 100 microns per minute). Other ranges are also possible.

The carbon-based nanostructures may grow from the precursors for any amount of time. In certain embodiments, the growth may occur over a time period of greater than or equal to 1 minute, greater than or equal to 2 minutes, greater than or equal to 5 minutes, greater than or equal to 10 minutes, greater than or equal to 15 minutes, greater than or equal to 30 minutes, or greater than or equal to 60 minutes. The growth may occur over a period of less than or equal to 90 minutes, less than or equal to 60 minutes, less than or equal to 30 minutes, less than or equal to 15 minutes, less than or equal to 10 minutes, less than or equal to 5 minutes, or less than or equal to 2 minutes. Combinations of the above-referenced ranges are also possible (e.g., greater than or equal to 5 minutes and less than or equal to 15 minutes). Other ranges are also possible.

In some embodiments, carbon-based nanostructures may be grown on active growth materials which are subsequently removed from the carbon-based nanostructures. For example, the carbon-based nanostructures may be grown on the active growth material at a first temperature and then may be heated to a second, higher, temperature at which the active growth material is removed (e.g., by thermal evaporation). In some embodiments, the active growth material may be removed at a temperature of greater than or equal to 800° C., greater than or equal to 900° C., greater than or equal to 1000° C., greater than or equal to 1100° C., greater than or equal to 1200° C., greater than or equal to 1300° C., greater than or equal to 1400° C., greater than or equal to 1500° C., greater than or equal to 1600° C., greater than or equal to 1700° C., greater than or equal to 1800° C., or greater than or equal to 1900° C. In some embodiments, the active growth material may be removed at a temperature of less than or equal to 2000° C., less than or equal to 1900° C., less than or equal to 1800° C., less than or equal to 1700° C., less than or equal to 1600° C., less than or equal to 1500° C., less than or equal to 1400° C., less than or equal to 1300° C., less than or equal to 1200° C., less than or equal to 1100° C., less than or equal to 1000° C., or less than or equal to 900° C. Combinations of the above-referenced ranges are also possible (e.g., greater than or equal to 800° C. and less than or equal to 1200° C., or greater than or equal to 800° C. and less than or equal to 2000° C.). Other ranges are also possible. In some embodiments, the active growth material may be removed (e.g., at a temperature as described above) while exposed to 800 sccm Argon at atmospheric pressure. In certain embodiments, the active growth material may be removed (e.g., at a temperature as described above) while held at a pressure of $10^{-5}$ Torr. Without wishing to be bound by any particular theory, it is believed that active growth material removal may be beneficial when the carbon-based nanostructures are designed to be incorporated into functional devices (e.g., thin film solar cells, field effect transistors), as certain active growth materials may interfere with device performance.

In certain embodiments, the active growth material, or a precursor thereof, is supported by a substrate. The substrate can be a single material or it may be a composite substrate that includes more than one component. A variety of growth substrates may be used in accordance with certain of the systems and methods described herein. Growth substrates may comprise any material capable of supporting the active growth material, or a precursor thereof, and/or the carbon-based nanostructures that are grown. The growth substrate may be selected to be inert to and/or stable under sets of conditions used in a particular process, such as nanostructure growth conditions, nanostructure removal conditions, and the like. In some cases, the growth substrate comprises a substantially flat surface. In some cases, the growth substrate comprises a substantially nonplanar surface. For example, the growth substrate may comprise a cylindrical surface.

In some embodiments, the substrate may be a solid. According to certain embodiments, the solid may be a single phase material such as a metal, ceramic, or polymer. The solid may be a composite, in some embodiments. In certain embodiments, the solid may be in any state of crystallinity including single crystalline, polycrystalline, semicrystalline, and/or amorphous.

According to certain embodiments, the substrate (or a component of a composite substrate) can be sensitive to elevated temperatures. For example, in some embodiments, the substrate (or a component of a composite substrate) can undergo a phase change or a substantial loss of mass when heated to relatively low temperatures. One advantage of certain (although not necessarily all) embodiments is that carbon-based nanostructures can be grown at relatively low temperatures, which can allow for the growth of carbon-based nanostructures on substrates that were believed to be too temperature-sensitive to support carbon-based nanostructure growth without changing phase or degrading.

According to certain embodiments, the active growth material, or a precursor thereof, is supported by a substrate that undergoes a phase change or substantial loss of mass when at a temperature below 800° C. in a 100% nitrogen atmosphere. To determine whether a particular substrate undergoes α phase change or a substantial loss of mass when at a temperature below 800° C. in a 100% nitrogen atmosphere, one would heat the substrate within the 100% nitrogen atmosphere from 25° C. at a ramp rate of 5° C./minute. If the substrate undergoes α phase change at any temperature below 800° C. under these conditions, then the substrate would be said to undergo a phase change at a temperature below 800° C. in a 100% nitrogen atmosphere. If the substrate undergoes a substantial loss of mass (i.e., a loss of mass of 0.1% or more, relative to the initial mass, such as a loss of 0.5% or more, 1% or more, 2% or more, or 5% or more) at any temperature below 800° C. under these conditions, then the substrate would be said to undergo a substantial loss of mass at a temperature below 800° C. in a 100% nitrogen atmosphere. In some embodiments, the substrate can be a substrate that undergoes α phase change or substantial loss of mass when at a temperature below 700° C., below 650° C., below 600° C., below 550° C., below 500° C., below 475° C., below 450° C., or below 425° C. in a 100% nitrogen atmosphere. Other ranges are also possible. In certain embodiments, a composite substrate is employed, and the component of the composite substrate that contacts carbon-based nanostructures can be one that undergoes α phase change or substantial loss of mass when at a temperature below 800° C., below 700° C., below 650° C., below 600° C., below 550° C., below 500° C., below 475° C., below 450° C., or below 425° C. in a 100% nitrogen atmosphere.

According to certain embodiments, the active growth material, or a precursor thereof, is supported by a substrate that undergoes α phase change or substantial change in mass when at a temperature below 650° C. in a 100% oxygen atmosphere. To determine whether a particular substrate undergoes α phase change or a substantial change in mass when at a temperature below 650° C. in a 100% oxygen atmosphere, one would heat the substrate within the 100% oxygen atmosphere from 25° C. at a ramp rate of 5° C./minute. If the substrate undergoes α phase change at any temperature below 650° C. under these conditions, then the substrate would be said to undergo a phase change at a temperature below 650° C. in a 100% oxygen atmosphere. If the substrate undergoes a substantial change in mass (i.e., a gain or loss of mass of 0.1% or more, relative to the initial mass, such as a gain or loss of mass of 0.5% or more, 1% or more, 2% or more, or 5% or more) at any temperature below 650° C. under these conditions, then the substrate would be said to undergo a substantial change in mass at a temperature below 650° C. in a 100% oxygen atmosphere. In some embodiments, the substrate can be a substrate that undergoes α phase change or a substantial change in mass when at a temperature below 600° C., below 550° C., below 500° C., below 475° C., below 450° C., or below 425° C. in a 100% oxygen atmosphere. Other ranges are also possible. In certain embodiments, a composite substrate is employed, and the component of the composite substrate that contacts carbon-based nanostructures can be one that undergoes α phase change or substantial change in mass when at a temperature below 650° C., below 600° C., below 550° C., below 500° C., below 475° C., below 450° C., or below 425° C. in a 100% oxygen atmosphere.

In some embodiments, the phase change that the substrate undergoes (e.g., within any of the temperature ranges outlined above) may comprise a glass transition, a transition between different crystal structures, a melting transition, a vaporization or condensation transition, sublimation, and/or the transition to a plasma. In some embodiments, the phase change that the substrate undergoes (e.g., within any of the temperature ranges outlined above) comprises a glass transition. In some embodiments, the phase change that the substrate undergoes (e.g., within any of the temperature ranges outlined above) comprises melting. In certain embodiments, the phase change that the substrate undergoes (e.g., within any of the temperature ranges outlined above) comprises vaporization and/or sublimation. One of ordinary skill in the art would be aware of methods for measuring α phase transition. For example, phase transitions can be assessed by differential scanning calorimetry, polarized light microscopy, rheology, visual observation, or other methods.

In some embodiments, the substrate as a whole undergoes the substantial change (e.g., increase or decrease) in mass and/or phase change under the conditions described above. In certain embodiments, a component of a composite substrate may undergo the substantial change (e.g., increase or decrease) in mass and/or phase change under the conditions described above. For example, in some embodiments, a composite substrate comprising a fiber and a sizing layer may be used as a substrate. In some such embodiments, the sizing layer of the composite substrate may undergo a phase change and/or a substantial change in mass when processed as outlined above (e.g., at at least one temperature below 800° C. when in a nitrogen and/or oxygen atmosphere, as described above).

In accordance with certain embodiments, a substantial change in mass (e.g., of a substrate or a component of a composite substrate) is a change in mass (an increase or decrease) greater than or equal to 0.1% of the initial mass (e.g., when under a nitrogen and/or oxygen atmosphere, as described above). In some embodiments, the substantial change in mass can be greater than or equal to 0.5%, 1%, 2%, 5%, 10%, 20%, or 50% of the initial mass (e.g., when under a nitrogen and/or oxygen atmosphere, as described above). One of ordinary skill in the art would also be aware of methods for measuring mass loss. For example, mass loss can be assessed by thermogravimetric analysis (under the appropriate atmosphere). In some embodiments, the substrate does not undergo a phase transition or substantial loss of mass (i.e., a loss of mass of more than 0.1%) during the nanostructure growth process. In some embodiments, the substrate does not undergo a phase transition during the nanostructure growth process. In certain embodiments, the substrate does not undergo a substantial loss of mass during the nanostructure growth process. In other embodiments, the substrate may undergo a phase transition during the nanostructure growth process.

According to some embodiments, the substrate (e.g., on which the active growth material and/or the carbon based nanostructures are supported) is a polymeric substrate. Generally, polymers are materials comprising three or more repeating mer units in their chemical structure. Polymers may comprise additional repeating units and may have any molecular weight. In some embodiments, the substrate may comprise polymers that are in the form of fibers, or may comprise polymeric fibers.

In some embodiments, the polymer of the substrate has a number average molecular weight of greater than or equal to 1,000 Da, greater than or equal to 5,000 Da, greater than or equal to 10,000 Da, greater than or equal to 25,000 Da, greater than or equal to 50,000 Da, greater than or equal to 100,000 Da, or greater than or equal to 500,000 Da. The polymer in the substrate may have a number average molecular weight less than or equal to 1,000,000 Da, less than or equal to 500,000 Da, less than or equal to 100,000 Da, less than or equal to 50,000 Da, less than or equal to 25,000 Da, less than or equal to 10,000 Da, or less than or equal to 5,000 Da. Combinations of the above-referenced ranges are also possible (e.g., greater than or equal to 10,000 Da and less than or equal to 50,000 Da). Other ranges are also possible.

In certain embodiments, the polymer of the substrate has a weight average molecular weight of greater than or equal to 1,000 Da, greater than or equal to 5,000 Da, greater than or equal to 10,000 Da, greater than or equal to 25,000 Da, greater than or equal to 50,000 Da, greater than or equal to 100,000 Da, or greater than or equal to 500,000 Da. The polymer in the substrate may have a weight average molecular weight less than or equal to 1,000,000 Da, less than or equal to 500,000 Da, less than or equal to 100,000 Da, less than or equal to 50,000 Da, less than or equal to 25,000 Da, less than or equal to 10,000 Da, or less than or equal to 5,000 Da. Combinations of the above-referenced ranges are also possible (e.g., greater than or equal to 10,000 Da and less than or equal to 50,000 Da). Other ranges are also possible.

The polymer in the substrate may have any chain structure in accordance with certain embodiments. In some embodiments, polymers may be linear, branched, and/or crosslinked molecules. Or they may be in the form of a crosslinked network. Polymers may have branches or crosslinks of any molecular weight, functionality, and/or spacing. In accordance with some embodiments, the polymers may be highly monodisperse. In accordance with other embodiments, the polymers may be polydisperse. One of ordinary skill in the art would be aware of methods for dispersity. For example, dispersity can be assessed by size-exclusion chromatography.

Polymeric substrates may have any desired mechanical property. In certain embodiments, polymeric substrates are rubbery, glassy, and/or semicrystalline.

In some embodiments, the polymers can be homopolymers, blends of polymers, and/or copolymers. Copolymers may be random copolymers, tapered copolymers, and block copolymers. In certain embodiments, block copolymers with more than three blocks may comprise two or more blocks formed from the same monomer. Blends of polymers can be phase separated or single phase, according to some embodiments.

In some embodiments, polymers may be organic polymers, inorganic polymers, or organometallic polymers. It may be advantageous, according to certain but not necessarily all embodiments, for the substrate to comprise an organic polymer material. In such embodiments, at least 50%, at least 75%, at least 90%, at least 95%, or at least 99%, or 100% of the polymeric substrate is made up of organic polymer material. In certain embodiments, polymers are of synthetic origin. Polymers of synthetic origin may be formed by either step growth or chain growth processes, and may be further functionalized after polymerization. Non-limiting examples of suitable polymers include polystyrene, polyethylene, polypropylene, poly(methyl methacrylate), polyacrylonitrile, polybutadiene, polyisoprene, poly(dimethyl siloxane), poly(vinyl chloride), poly(tetrafluoroethylene), polychloroprene, poly(vinyl alcohol), poly(ethylene oxide), polycarbonate, polyester, polyamide, polyimide, polyurethane, poly(ethylene terephthalate), polymerized phenol-formaldehyde resin, polymerized epoxy resin, paraamid fibers, silk, collagen, keratin, and gelatin. Additional examples of suitable polymers that can be used in the growth substrate include, but are not limited to, relatively high temperature fluoropolymers (e.g., Teflon®), polyetherether ketone (PEEK), and polyether ketone (PEK). In some embodiments, the polymer is not a polyelectrolyte.

In some embodiments, polymeric substrates my further comprise additives. Polymeric substrates may be in the form of a gel and comprise solvent, according to certain embodiments. In some embodiments, polymeric substrates may comprise one or more of fillers, additives, plasticizers, small molecules, and particles comprising ceramic and/or metal. In certain embodiments, greater than or equal to 50%, greater than or equal to 80%, greater than or equal to 90%, greater than or equal to 95%, or greater than or equal to 99% of the mass of the polymeric substrate may comprise polymers. Other ranges are also possible.

According to certain embodiments, the polymer may form one component of a composite substrate. For example, the polymer can be a coating formed over a fiber, such as a carbon fiber. As one non-limiting example, in some embodiments, the substrate comprises a sized carbon fiber.

In some embodiments, the substrate may comprise carbon (e.g., amorphous carbon, carbon aerogel, carbon fiber, graphite, glassy carbon, carbon-carbon composite, graphene, aggregated diamond nanorods, nanodiamond, diamond, and the like).

Figure 1C:
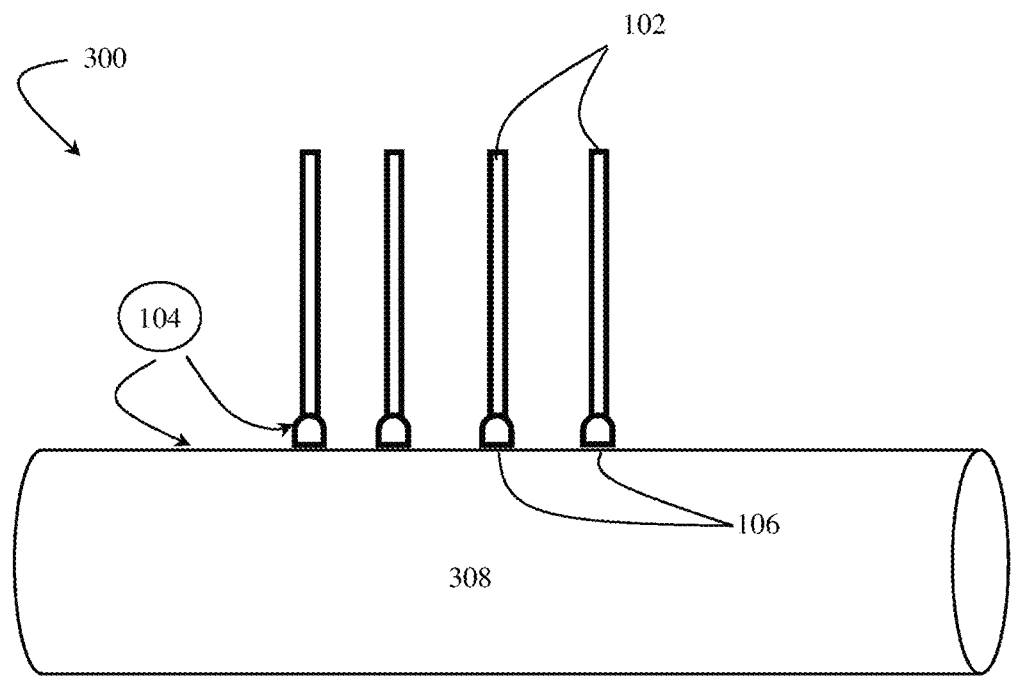
FIG. 1C is, according to certain embodiments, a perspective schematic illustration showing a method of growing carbon-based nanostructures on an elongated substrate, such as an unsized or desized carbon fiber substrate.

In accordance with certain embodiments, the substrate (e.g., on which the active growth material, or a precursor thereof, and/or the carbon-based nanostructures are supported) comprises a fiber. For example, in some embodiments, the active growth material, active growth material precursor, and/or carbon-based nanostructures are supported on a carbon fiber. In certain embodiments, the active growth material, active growth material precursor, and/or carbon-based nanostructures are supported on a glass fiber. In accordance with some embodiments, the active growth material, active growth material precursor, and/or carbon-based nanostructures are supported on fibers comprising one or more of the following materials: carbon; carbon glass; glass; alumina; basalt; metals (e.g., steel, aluminum, titanium); aramid (e.g., Kevlar®, meta-aramids such as Nomex®, p-aramids); liquid crystalline polyester; poly(p-phenylene-2,6-benzobisoxazole) (PBO); polyethylene (e.g., Spectra®) poly{2,6-diimidazo[4,5-b:4',5'-e]pyridinylene-1, 4-(2,5-dihydroxy)phenylene}; and combinations of these. In some embodiments, the active growth material, active growth material precursor, and/or carbon-based nanostructures are supported on fibers comprising at least one of polyetherether ketone (PEEK) and polyether ketone (PEK). For example, in FIG. 1C, substrate 308 is an elongated substrate, and can correspond to, for example, a fiber such as a carbon fiber. Substrate 308 can be in direct contact with active growth material 106. In some such embodiments, carbon-based nanostructures 102 can be grown from precursor 104 on active growth material 106.

As noted above, in some embodiments, the active growth material, active growth material precursor, and/or carbon based nanostructures are supported on a carbon fiber (e.g., a sized carbon fiber or an unsized carbon fiber). Any suitable type of carbon fiber can be employed including, for example, aerospace-grade carbon fibers, auto/sport grade carbon fibers, and/or microstructure carbon fibers. In certain embodiments, intermediate modulus (IM) or high modulus (HM) carbon fibers can be employed. In some embodiments, poly(acrylonitrile)-derived carbon fibers can be employed. Certain embodiments of the invention are advantageous for use with carbon fibers that carry a large degree of their tensile strengths in their outer skins (e.g., fibers in which at least 50%, at least 75%, or at least 90% of the tensile strength is imparted by the portion of the fiber located a distance away from the outer skin of the fiber of less than 0.1 times or less than 0.05 times the cross-sectional diameter of the fiber), such as aerospace grade intermediate modulus carbon fibers.

In certain embodiments, the substrate can be a carbon-based substrate. In some embodiments, the carbon-based growth substrate contains carbon in an amount of at least 75 wt %, at least 90 wt %, at least 95 wt %, or at least 99 wt %. That is to say, in some embodiments, at least 75 wt %, at least 90 wt %, at least 95 wt %, or at least 99 wt % of the carbon-based growth substrate is made of carbon.

In certain embodiments, the substrate is a metallic substrate. For example, in some embodiments, the substrate is made up of a single metal or a combination of multiple metals (e.g., a metal alloy). In some embodiments, the substrate comprises copper, aluminum, nickel, tungsten, tantalum, chromium, titanium, vanadium, niobium, platinum, molybdenum, silver, gold, and/or alloys thereof.

In some embodiments, the growth substrate can be elongated. For example, the ratio of the length of the growth substrate (e.g., a fiber substrate) to the diameter or other cross-sectional dimension of the growth substrate can be, in some embodiments, at least 2:1; at least 3:1; at least 5:1; at least 10:1; at least 50:1; at least 100:1; at least 500:1; at least 1000:1; at least 10,000:1; at least 100,000:1; at least $10^6$:1; at least $10^7$:1; at least $10^8$:1; or at least $10^9$:1.

In certain embodiments, fibers (e.g., carbon fibers) used as growth substrates can have relatively large cross-sectional dimensions (e.g., relative to the nanostructures grown over the fiber substrate). For example, in certain embodiments, a fiber growth substrate can have a smallest cross-sectional dimension of at least 1 micrometer, at least 5 micrometers, or at least 10 micrometers (and/or, in certain embodiments, less than 1 mm, less than 100 micrometers, or less than 20 micrometers). Generally, the smallest cross-sectional dimension is measured perpendicularly to the length of the fiber and through the longitudinal axis of the fiber.

In certain embodiments, the active growth material, active growth material precursor, and/or carbon-based nanostructures are supported on a sized carbon fiber. The sized carbon fiber can be a single carbon fiber or part of a collection of a plurality of fibers. The collection of fibers may be, according to certain embodiments, a unidirectional collection, a tow, or a weave. Those of ordinary skill in the art are familiar with "sized" fibers (including "sized" carbon fibers). Sized fibers generally include a coating material (e.g., a polymer or other coating material) that protects the underlying fiber material (e.g., carbon) from oxygen and/or other chemicals in the surrounding environment. According to certain embodiments, the sized fiber comprise one or more polymers within the sizing layer. Non-limiting examples of polymers that may be included in the sizing of a sized fiber (e.g., a sized carbon fiber) are organosilanes, epoxies, urethanes, polyesters, oligomer polyimides, phenylethynyl-terminated imide oligomers, oligomer polyamides, polyhydroxyethers, nylons, and combinations of these. In some embodiments, the polymer of the sizing material is not a polyelectrolyte.

Figure 1D:
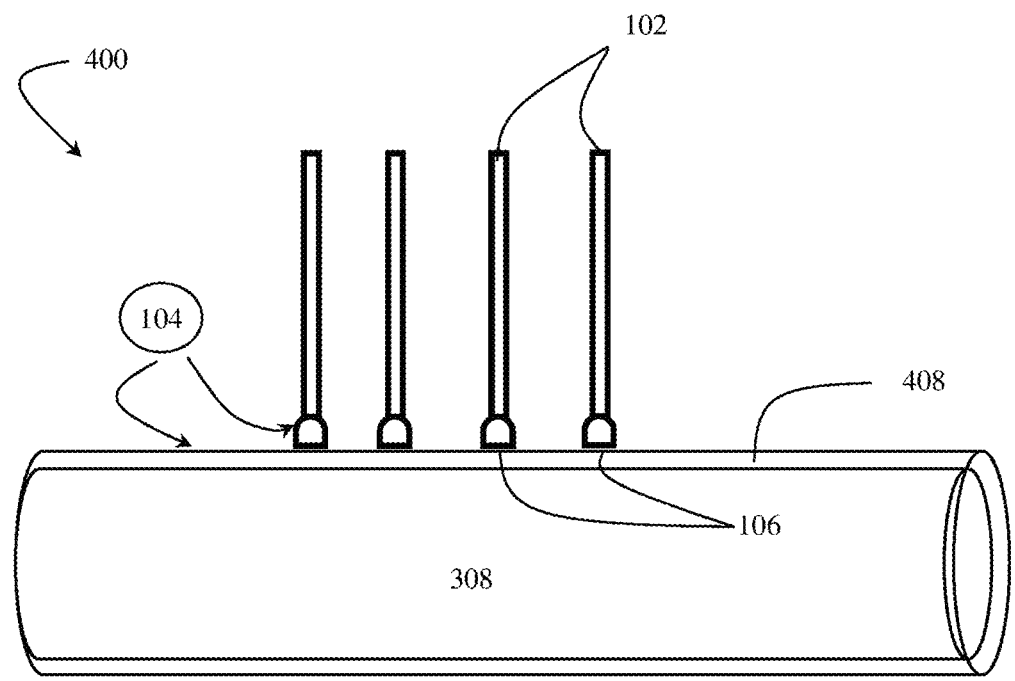
FIG. 1D is a perspective schematic illustration showing a method of growing carbon-based nanostructures on an elongated substrate that is at least partially coated, such as a sized carbon fiber substrate, according to certain embodiments.

For example, in FIG. 1D, substrate 308 can be a fiber, such as a carbon fiber. Material 408 can be a polymeric material, such as sizing that is applied to sized fibers (e.g., sized carbon fibers). In some such embodiments, active growth material 106 can be applied to material 408. In some embodiments, carbon-based nanostructures 102 can be grown on active growth material 106 (as well as on material 408 and substrate 308) from nanostructure precursor 104. According to certain embodiments, the carbon-based nanostructures can be grown without causing material 408 to lose a substantial amount of mass (i.e., a loss of mass of 0.1% or more, or, in some cases, any of the other ranges described elsewhere herein) and/or without causing material 408 to undergo a phase change.

In certain embodiments, the active growth material, active growth material precursor, and/or carbon-based nanostructures are supported on a prepreg. As used herein, the term "prepreg" refers to one or more layers of thermoset or thermoplastic resin containing embedded fibers, for example fibers of carbon, glass, silicon carbide, and the like. In some embodiments, the thermoset material includes epoxy, rubber strengthened epoxy, BMI, PMK-15, polyesters, and/or vinylesters. In certain embodiments, the thermoplastic material includes polyamides, polyimides, polyarylene sulfide, polyetherimide, polyesterimides, polyarylenes, polysulfones, polyethersulfones, polyphenylene sulfide, polyetherimide, polypropylene, polyolefins, polyketones, polyetherketones, polyetherketoneketone, polyetheretherketones, and/or polyester. According to certain embodiments, the prepreg includes fibers that are aligned and/or interlaced (woven or braided). In some embodiments, the prepregs are arranged such the fibers of many layers are not aligned with fibers of other layers, the arrangement being dictated by directional stiffness requirements of the article to be formed. In certain embodiments, the fibers cannot be stretched appreciably longitudinally, and thus, each layer cannot be stretched appreciably in the direction along which its fibers are arranged. Exemplary prepregs include TORLON thermoplastic laminate, PEEK (polyether etherketone, Imperial Chemical Industries, PLC, England), PEKK (polyetherketone ketone, DuPont) thermoplastic, T800H/3900 2 thermoset from Toray (Japan), and AS4/3501 6 thermoset from Hercules (Magna, Utah).

In some embodiments in which substrates are employed, the active growth material (or precursor thereof), the growth substrate, and/or the conditions under which the nanostructures are grown are selected such that the amount of chemical interaction or degradation between the substrate and the active growth material is relatively small. For example, in some cases, the active growth material does not diffuse significantly into or significantly chemically react with the substrate during formation of the nanostructures. One of ordinary skill in the art will be able to determine whether a given active growth material has diffused significantly into or significantly chemically reacted with a substrate. For example, X-ray photoelectron spectroscopy (XPS), optionally with depth profiling, may be used to determine whether an active growth material has diffused into a substrate or whether elements of the substrate have diffused into the active growth material. X-ray diffraction (XRD), optionally coupled with XPS, may be used to determine whether an active growth material and a substrate have chemically reacted with each other. Secondary ion mass spectroscopy (SIMS) can be used to determine chemical composition as a function of depth.

Figure 3:
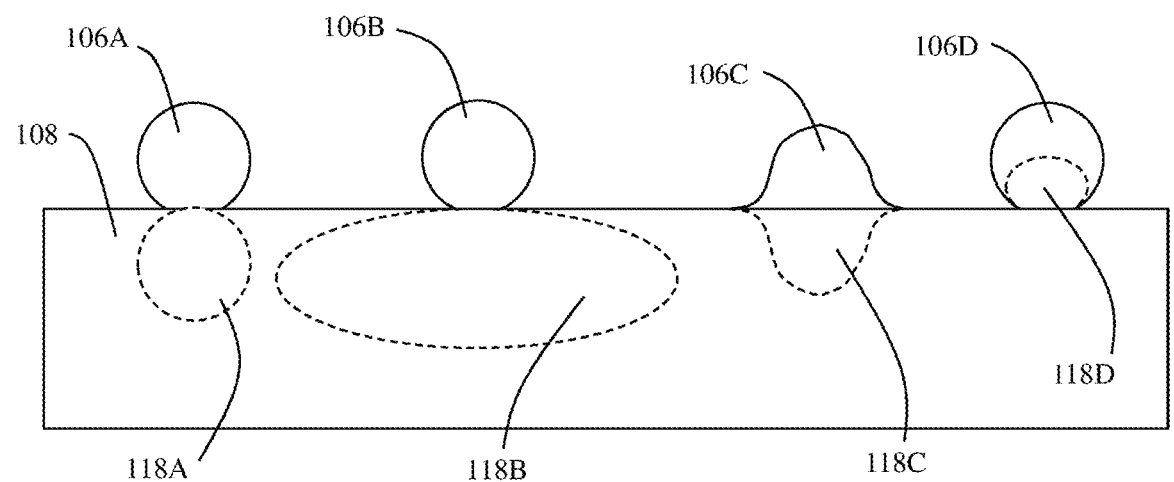
FIG. 3 is an exemplary cross-sectional schematic illustration showing possible interaction volumes between an active growth material and a substrate.

FIG. 3 illustrates a set of embodiments in which active growth material or active growth material precursor 106 can interact with substrate 108. The volume within which the active growth material or active growth material precursor interacts with the substrate is shown as volume 118. In FIG. 3, spherical active growth material or active growth material precursor 106A interacts with substrate 108 over volume 118A, which is roughly equivalent to the original volume of active growth material or active growth material precursor 102A. Spherical active growth material or active growth material precursor 106B interacts with substrate 108 over volume 118B, which is roughly equivalent to three times the original volume of active growth material or active growth material precursor 102B. Wetted active growth material or active growth material precursor 106C is shown interacting with substrate 108 over volume 118C, which is roughly equivalent to the original volume of active growth material or active growth material precursor 106C. In addition, substrate 108 is illustrated diffusing into active growth material or active growth material precursor 106D, with the interaction volume indicated as volume 118D. In some embodiments, chemical reaction between the active growth material or active growth material precursor and the substrate may occur, in which case the volume within which the active growth material or active growth material precursor and the substrate interact is defined by the volume of the reaction product. The volume of the chemical product may be determined, for example, via XPS analysis, using XRD to determine the chemical composition of the product and verify that it originated from the active growth material or active growth material precursor. In some embodiments, the active growth material or active growth material precursor may diffuse into the substrate or the substrate may diffuse into the active growth material or active growth material precursor, in which case the volume within which the active growth material or active growth material precursor and the substrate interact is defined by the volume over which the active growth material, active growth material precursor, and/or the substrate diffuses. The volume over which an active growth material or active growth material precursor diffuses can be determined, for example, using XPS with depth profiling.

In some embodiments, the volume within which the active growth material interacts with the substrate (e.g., the volume of the product produced via a chemical reaction between the active growth material and the substrate, the volume over which the active growth material and/or substrate diffuses into the other, etc.) is relatively small compared to the original volume of the active growth material as formed on the substrate. In some instances, the volume of the active growth material as formed on the substrate is at least 0.1%, at least 0.5%, at least 1%, at least 5%, at least 10%, at least 25%, at least 50%, at least 100%, at least 200%, at least 500%, at least 2500%, at least 5000%, at least 10,000%, at least 50,000%, or at least 100,000% greater than the volume within which the active growth material interacts with the substrate (e.g., via reaction, via diffusion, via a combination of mechanisms, etc.).

In some embodiments, the mass percentage of the active growth material that interacts with the substrate (e.g., via reaction of the active growth material and the substrate, diffusion of the active growth material into substrate, diffusion of the substrate into the active growth material, or a combination of these) is relatively low. In some embodiments, less than 50 atomic %, less than 25 atomic %, less than 10 atomic %, less than 5 atomic %, less than 2 atomic %, or less than 1 atomic % of the active growth material as formed on the substrate interacts with the substrate. The percentage of the active growth material that interacts with the substrate can be determined, for example, using XPS with depth profiling. Optionally, XRD can be employed to determine the composition of the measured material.

In some cases, the electrical resistance of the substrate does not change, from the beginning to the end of the nanostructure growth process, by more than 100%, by more than 50%, by more than 25%, by more than 10%, by more than 5%, or by more than 1% relative to the electrical resistance of a substrate exposed to essentially identical conditions in the absence of the active growth material. In some embodiments, the electrical resistance of the substrate does not decrease, from the beginning to the end of the nanostructure growth process, by more than 50%, by more than 25%, by more than 10%, by more than 5%, or by more than 1% relative to the electrical resistance of a substrate exposed to essentially identical conditions in the absence of the active growth material.

As noted above, in some embodiments, the growth substrate (when present) is electrically conductive.

According to certain embodiments, the growth substrate (e.g., the portion(s) of the growth substrate that contacts the active growth material) has a relatively low sheet resistance. For example, in some embodiments, the growth substrate (e.g., the portion(s) of the growth substrate that contacts the active growth material) has a sheet resistance, at 20° C., of less than or equal to 1 ohm/square, less than or equal to 0.1 ohm/square, less than or equal to 0.01 ohm/square, less than or equal to 1 milliohm/square, less than or equal to 0.1 milliohm/square, less than or equal to 0.01 milliohm/square, less than or equal to 1 microohm/square, less than or equal to 0.1 microohm/square, less than or equal to 0.01 microohm/square, or less (and/or, in some embodiments, as low as 0.001 microohm/square, as low as 0.0001 microohm/square, as low as 0.00001 microohm/square, as low as 0.000001 microohm/square, or less). Combinations of these ranges are also possible (e.g., less than or equal to 1 ohm/square and as low as 0.000001 microohm/square at 20° C.). Sheet resistance can be measured using a 4-point probe.

In some embodiments, the growth substrate has an electrical resistivity of less than or equal to $10^{-2}$ ohm-m, less than or equal to $10^{-3}$ ohm-m, less than or equal to $10^{-4}$ ohm-m, less than or equal to $10^{-5}$ ohm-m, less than or equal to $10^{-6}$ ohm-m, less than or equal to $10^{-7}$ ohm-m, or less at 20° C. In some embodiments, the growth substrate has an electrical resistivity of as low as $10^{-8}$ ohm-m, $10^{-9}$ ohm-m, $10^{-10}$ ohm-m, $10^{-12}$ ohm-m, $10^{-15}$ ohm-m, or less at 20° C. Combinations of these ranges are also possible (e.g., less than or equal to $10^{-2}$ ohm-m and as low as $10^{-15}$ ohm-m at 20° C.). As one non-limiting example, in some embodiments, copper, which has an electrical resistivity of about $1.7 \times 10^{-8}$ ohm-m at 20° C., could be used as a growth substrate. As another example, graphite having (at 20° C.) an electrical resistivity of between about $2.5 \times 10^{-6}$ ohm-m and $5.0 \times 10^{-6}$ ohm-m parallel to the basal plane, could be used as a growth substrate. The electronic resistivity of a substrate can be determined by measuring the resistance across the substrate, and calculating the resistivity using the dimensions of the substrate. Once the resistance measurement has been made, the electronic resistivity of the substrate can be back calculated using the geometry across which the resistance was measured, as follows:

$$\text{Resistivity} = \frac{A \cdot R}{l}$$

where A is the cross-sectional area of the substrate orthogonal to the length along which the resistance measurement is made, R is the measured resistance value, and l is the length along which the resistance measurement is made.

Non-limiting examples of electrically conductive materials from which the substrate may be formed include metals and/or metal alloys (e.g., copper, aluminum, nickel, tungsten, tantalum, chromium, titanium, vanadium, niobium, platinum, molybdenum, silver, gold, and/or alloys thereof); carbon (e.g., graphitic carbon, carbon fibers, etc.); and electrically conductive polymers.

In some cases, the nanostructures may be removed from a substrate after the nanostructures are formed. For example, the act of removing may comprise transferring the nanostructures directly from the surface of the substrate to a surface of a receiving substrate. The receiving substrate may be, for example, a polymer material or a carbon fiber material. In some cases, the receiving substrate comprises a polymer material, metal, or a fiber comprising $Al_2O_3$, $SiO_2$, carbon, or a polymer material. In some cases, the receiving substrate comprises a fiber comprising $Al_2O_3$, $SiO_2$, carbon, or a polymer material. In some embodiments, the receiving substrate is a fiber weave.

Removal of the nanostructures may comprise application of a mechanical tool, mechanical or ultrasonic vibration, a chemical reagent, heat, or other sources of external energy, to the nanostructures and/or the surface of the growth substrate. In some cases, the nanostructures may be removed by application of compressed gas, for example. In some cases, the nanostructures may be removed (e.g., detached) and collected in bulk, without attaching the nanostructures to a receiving substrate, and the nanostructures may remain in their original or "as-grown" orientation and conformation (e.g., in an aligned "forest") following removal from the growth substrate. Systems and methods for removing nanostructures from a substrate, or for transferring nanostructures from a first substrate to a second substrate, are described in International Patent Application Serial No. PCT/US2007/011914, filed May 18, 2007, entitled "Continuous Process for the Production of Nanostructures Including Nanotubes," which is incorporated herein by reference in its entirety.

In some embodiments, the active growth material may be removed from the growth substrate and/or the nanostructures after the nanostructures are grown. Active growth material removal may be performed mechanically, for example, via treatment with a mechanical tool to scrape or grind the active growth material from a surface (e.g., of a substrate). In some cases, the first active growth material may be removed by treatment with a chemical species (e.g., chemical etching) or thermally (e.g., heating to a temperature which evaporates the active growth material). For example, in some embodiments, the active growth material may be removed via an acid etch (e.g., HCl, HF, etc.), which may, for example, selectively dissolve the active growth material. For example, HF can be used to selectively dissolve oxides. In some embodiments, the first active growth material may be removed by a combination of treatment with a chemical species and treatment with heat (e.g., the first active growth material may be heated in the presence of $H_2$). When heating is employed to remove the first active growth material, it may be applied by exposing the active growth material to a heated environment and/or by using an electron beam to heat the active growth material.

While growth of nanostructures using a growth substrate has been primarily described above in detail, the embodiments described herein are not so limited, and carbon-based nanostructures may be grown, in some embodiments, on an active growth material in the absence of a growth substrate. For example, FIG. 1B includes a schematic illustration of system 200 in which active growth material 106 is placed under a set of conditions selected to facilitate nanostructure growth in the absence of a substrate in contact with the active growth material. Nanostructures 102 may grow from active growth material 106 as the active growth material is exposed to the growth conditions. In some embodiments, the active growth material, or a precursor thereof, may be suspended in a fluid. For example, an active growth material, or a precursor thereof, may be suspended in a gas (e.g., aerosolized) and subsequently exposed to a carbon-containing precursor material, from which carbon nanotubes may be grown. In some cases, the active growth material, or a precursor thereof, may be suspended in a liquid (e.g., an alcohol that serves as a nanostructure precursor material) during the formation of the nanostructures. In some embodiments, unsupported active growth materials, or precursors thereof, are in contact with a gas or vacuum at every point comprising their surfaces. It should be noted that although the active growth material is depicted as a hemisphere in FIG. 1B, active growth materials with other shapes are also contemplated, such as active growth materials with spherical shapes, polygonal shapes, and the like.

As noted above, certain embodiments are related to systems and methods for growing carbon-based nanostructures. As used herein, the term "carbon-based nanostructure" refers to articles having a fused network of aromatic rings, at least one cross-sectional dimension of less than 1 micron, and comprising at least 30% carbon by mass. In some embodiments, the carbon-based nanostructures may comprise at least 40%, at least 50%, at least 60%, at least 70%, at least 80%, at least 90%, or at least 95% of carbon by mass, or more. The term "fused network" would not include, for example, a biphenyl group, wherein two phenyl rings are joined by a single bond and are not fused. Examples of carbon-based nanostructures include carbon nanotubes (e.g., single-walled carbon nanotubes, double-walled carbon nanotubes, multi-walled carbon nanotubes, etc.), carbon nanowires, carbon nanofibers, carbon nanoshells, graphene, fullerenes, and the like. In some embodiments, the carbon-based nanostructures comprise hollow carbon nanoshells and/or nanohorns.

In some embodiments, a carbon-based nanostructure may have a least one cross-sectional dimension of less than 500 nm, less than 250 nm, less than 100 nm, less than 75 nm, less than 50 nm, less than 25 nm, less than 10 nm, or, in some cases, less than 1 nm. Carbon-based nanostructures described herein may have, in some cases, a maximum cross-sectional dimension of less than 1 micron, less than 500 nm, less than 250 nm, less than 100 nm, less than 75 nm, less than 50 nm, less than 25 nm, less than 10 nm, or, in some cases, less than 1 nm.

According to certain embodiments, the carbon-based nanostructures are elongated carbon-based nanostructures. As used herein, the term "elongated carbon-based nanostructure" refers to a carbon based nanostructure structure having an aspect ratio greater than or equal to 10. In some embodiments, the elongated nanostructure can have an aspect ratio greater than or equal to 100, greater than or equal to 1000, greater than or equal to 10,000, or greater. Those skilled in the art would understand that the aspect ratio of a given structure is measured along the longitudinal axis of the elongated nanostructure, and is expressed as the ratio of the length of the longitudinal axis of the nanostructure to the maximum cross-sectional diameter of the nanostructure.

In some embodiments, the carbon-based nanostructures described herein may comprise carbon nanotubes. As used herein, the term "carbon nanotube" is given its ordinary meaning in the art and refers to a substantially cylindrical molecule or nanostructure comprising a fused network of primarily six-membered rings (e.g., six-membered aromatic rings) comprising primarily carbon atoms. In some cases, carbon nanotubes may resemble a sheet of graphite formed into a seamless cylindrical structure. In some cases, carbon nanotubes may include a wall that comprises fine-grained $sp^2$ sheets. In certain embodiments, carbon nanotubes may have turbostratic walls. It should be understood that the carbon nanotube may also comprise rings or lattice structures other than six-membered rings. Typically, at least one end of the carbon nanotube may be capped, i.e., with a curved or nonplanar aromatic structure. Carbon nanotubes may have a diameter of the order of nanometers and a length on the order of millimeters, or, on the order of tenths of microns, resulting in an aspect ratio greater than 100, 1000, 10,000, 100,000, $10^6$, $10^7$, $10^8$, $10^9$, or greater. Examples of carbon nanotubes include single-walled carbon nanotubes (SWNTs), double-walled carbon nanotubes (DWNTs), multi-walled carbon nanotubes (MWNTs) (e.g., concentric carbon nanotubes), inorganic derivatives thereof, organic derivatives thereof, and the like. In some embodiments, the carbon nanotube is a single-walled carbon nanotube. In some cases, the carbon nanotube is a multi-walled carbon nanotube (e.g., a double-walled carbon nanotube). In some cases, the carbon nanotube comprises a multi-walled or single-walled carbon nanotube with an inner diameter wider than is attainable from a traditional catalyst or other active growth material. In some cases, the carbon nanotube may have a diameter less than 1 micron, less than 500 nm, less than 250 nm, less than 100 nm, less than 50 nm, less than 25 nm, less than 10 nm, or, in some cases, less than 1 nm.

In some embodiments, the systems and methods described herein may be used to produce substantially aligned nanostructures. The substantially aligned nanostructures may have sufficient length and/or diameter to enhance the properties of a material when arranged on or within the material. In some embodiments, the set of substantially aligned nanostructures may be formed on a surface of a substrate, and the nanostructures may be oriented such that the long axes of the nanostructures are substantially non-planar with respect to the surface of the substrate. In some cases, the long axes of the nanostructures are oriented in a substantially perpendicular direction with respect to the surface of the substrate, forming a nanostructure array or "forest." The forest may comprise, according to some embodiments, at least 100 nanostructures, at least 1000 nanostructures, at least $10^4$ nanostructures, at least $10^5$ nanostructures, at least $10^6$ nanostructures, at least $10^7$ nanostructures, at least $10^8$ nanostructures, or more, for example, arranged in a side-by-side configuration. The alignment of nanostructures in the nanostructure "forest" may be substantially maintained, even upon subsequent processing (e.g., transfer to other surfaces and/or combining the forests with secondary materials such as polymers), in some embodiments. Systems and methods for producing aligned nanostructures and articles comprising aligned nanostructures are described, for example, in International Patent Application Serial No. PCT/US2007/011914, filed May 18, 2007, entitled "Continuous Process for the Production of Nanostructures Including Nanotubes"; and U.S. Pat. No. 7,537,825, issued on May 26, 2009, entitled "Nano-Engineered Material Architectures: Ultra-Tough Hybrid Nanocomposite System," which are incorporated herein by reference in their entirety.

Certain aspects are related to articles comprising substrates, polymeric material, and carbon-based nanostructures. As noted above, one advantage associated with certain, but not necessarily all, embodiments described herein is that carbon-based nanostructures can be grown on materials that would otherwise be incompatible with carbon-based nanostructure growth. For example, according to certain embodiments, the ability to grow carbon-based nanostructures at relatively low temperatures can allow one to grow carbon-based nanostructures on polymeric materials and/or other temperature-sensitive materials without substantially altering and/or damaging the temperature-sensitive materials.

In one set of embodiments, the inventive article comprises a substrate, a polymeric material at least partially coating the substrate, carbon-based nanostructures supported by the substrate, and an active growth material associated with the carbon-based nanostructures. One example of such an arrangement is illustrated, for example, in FIG. 1D. In FIG. 1D, material 408 (which can be a polymeric material) at least partially coats substrate 308. While substrate 308 is illustrated in FIG. 1D as being cylindrical, the substrate could have a variety of other suitable geometries. In FIG. 1D, active growth material 106 is supported by material 408 and substrate 308. In addition, carbon-based nanostructures 102 are illustrated as being supported by material 408 and substrate 308.

In some embodiments, the active growth material can be between the carbon-based nanostructures and the polymeric material. For example, referring to FIG. 1D, active growth material 106 is located between carbon-based nanostructures 102 and material 408. In some embodiments, the carbon-based nanostructures can be between the active growth material and the polymeric material. The carbon-based nanostructures and the active growth material can be in direct contact, according to certain embodiments.

The active growth material can be any of the active growth materials described above or elsewhere herein, including active growth materials comprising at least two components that are capable of forming a eutectic composition with each other and/or comprising at least a first type of cation, a second type of cation different from the first type of cation, and an anion. The active growth material can also have any of the forms described above or elsewhere herein.

The substrate of the article can be any of the substrates described elsewhere herein. In some embodiments, the substrate can be relatively temperature sensitive. For example, as described above, in some embodiments, the substrate (or a component of a composite substrate) undergoes a phase change or a substantial loss of mass at a temperature below 800° C. (or within any of the other temperature ranges described above or elsewhere herein) in a 100% nitrogen atmosphere. In certain embodiments, as described above, the substrate (or a component of a composite substrate) undergoes a phase change or a substantial change in mass at a temperature below 650° C. (or within any of the other temperature ranges described above or elsewhere herein) in a 100% oxygen atmosphere. In some embodiments, the substrate is an elongated substrate. For example, in some embodiments, the substrate comprises a fiber, such as a carbon fiber. In some embodiments, the substrate is a sized carbon fiber. For example, referring to FIG. 1D, substrate 308 can be a carbon fiber and material 408 can be a sizing material that at least partially coats the carbon fiber.

Examples of materials from which the sizing can be made are described, for example, above with respect to sized fibers.

In some embodiments, the polymeric material covers a relatively large percentage of the external surface of the substrate. For example, in some embodiments, the polymeric material covers at least 50%, at least 75%, at least 90%, at least 95%, at least 99%, or all of the external surface of the substrate. Referring to FIG. 1D, for example, material 408 covers 100% of the external surface of the substrate 308.

According to certain embodiments, the thickness of the polymeric material can be relatively consistent over the underlying substrate. For example, in certain embodiments, the thickness of the polymeric material, over at least 80% of the surface area of the substrate that is covered by the polymeric material, does not deviate from the average thickness of the polymeric material by more than 50%, more than 40%, more than 30%, more than 20%, more than 10%, or more than 5%. In some embodiments, the thickness of the polymeric material, over at least 90% (or at least 95%, at least 98%, or at least 99%) of the surface area of the substrate that is covered by the polymeric material, does not deviate from the average thickness of the polymeric material by more than 50%, more than 40%, more than 30%, more than 20%, more than 10%, or more than 5%. Such uniformity's may be observed, for example, in the sizing layer of certain sized fibers, such as certain sized carbon fibers.

The average thickness of the polymeric material can be, according to certain embodiments, relatively thin. For example, according to certain embodiments, the average thickness of the polymeric material can be less than 1 micron, less than 500 nm, less than 200 nm, less than 100 nm, less than 50 nm, or less than 10 nm (and/or, in certain embodiments, as little as 1 nm, as little as 0.1 mm, or less).

U.S. Provisional Application No. 62/519,115, filed Jun. 13, 2017, and entitled "Synthesis of Carbon-Based Nanostructures Using Eutectic Compositions" is incorporated herein by reference in its entirety for all purposes.

The following examples are intended to illustrate certain embodiments of the present invention, but do not exemplify the full scope of the invention.

Example 1

This Example describes the growth of carbon-based nanostructures from a $Li_xK_yCl_z$ active growth material.

Figure 4:
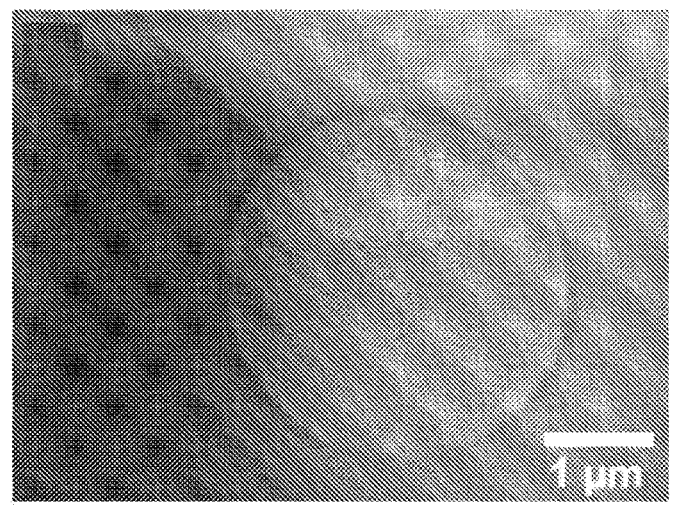
FIGS. 4 and 5 are micrographs of silicon wafers coated with active growth materials and/or precursors thereof, according to some embodiments.
Figure 5:
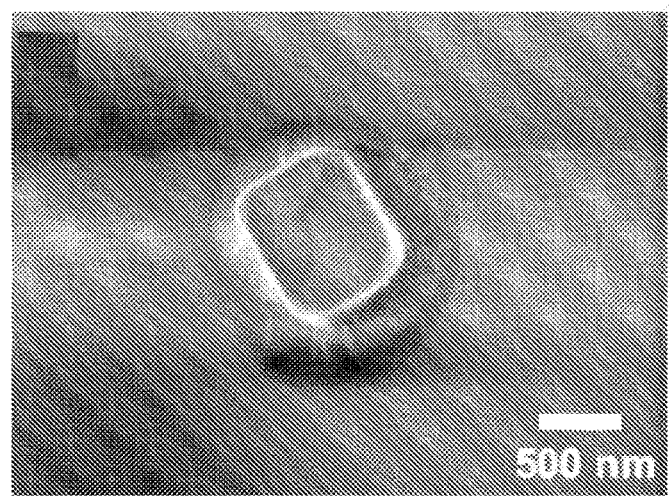

LiCl and KCl were dissolved together in methanol to form an active growth material precursor solution with a 6 mM lithium cation concentration, a 4 mM potassium cation concentration, and a 10 mM chloride anion concentration. A silicon wafer on which a 200 nm thick thermally grown oxide layer was disposed was cleaned using an RCA1 solution (a solution consisting of approximately 71.4 vol % ammonia hydroxide, 14.3 vol % hydrogen peroxide, and 14.3 vol % water) and then dip coated with the active growth material precursor solution. After dip coating, the coated silicon wafer was air dried at room temperature for 10 minutes, which allowed for complete evaporation of the methanol. FIGS. 4 and 5 show representative micrographs of the coated silicon wafer after this step.

The coated silicon wafer was then placed in the center of a fused quartz tube surrounded by an electric furnace. The coated silicon wafer was heated in the furnace to 450° C. under a gas flow of 400 sccm $H_2$ at atmospheric pressure and then held at that temperature for an annealing step of 10 minutes while the 400 sccm $H_2$ gas flow was maintained. Next, the gas flow was changed to 10 sccm of 10 vol % acetylene in Ar and 20 sccm of $CO_2$, a gas flow which was suitable for carbon-based nanostructure growth. This second gas flow was maintained for 30 minutes, after which the gas flow was changed to 1000 sccm He. The coated silicon wafer was cooled to room temperature under this third gas flow.

Figure 6:
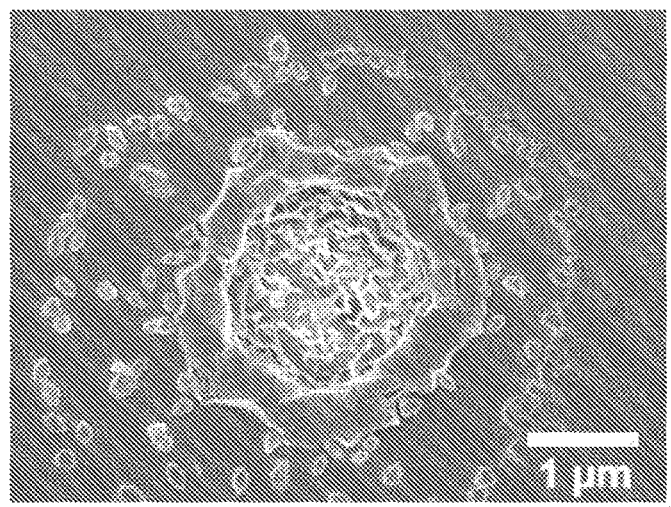
FIGS. 6 and 7 are micrographs of carbon-based nanostructures, according to some embodiments.
Figure 7:
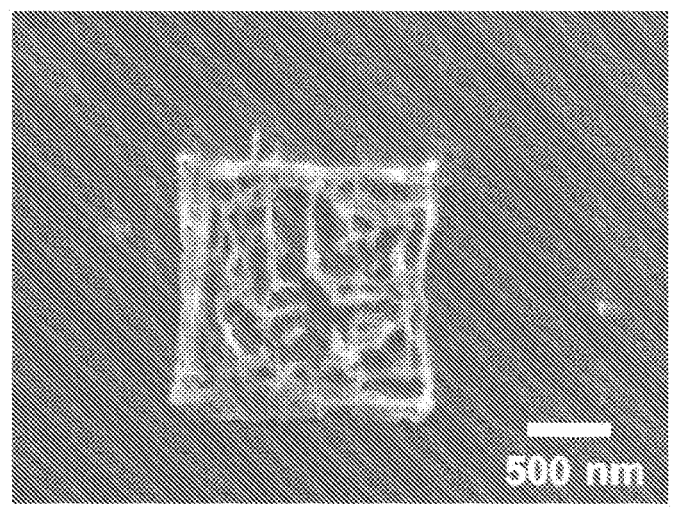
Figure 8:
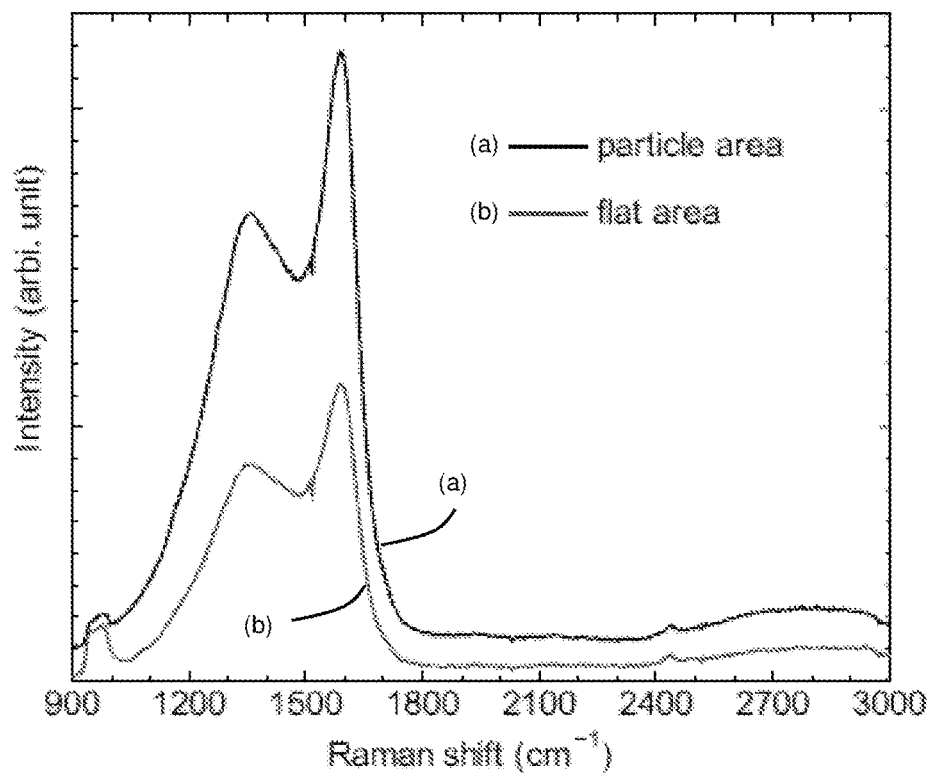
FIG. 8 is a chart showing intensity as a function of Raman shift, according to some embodiments.
Figure 9:
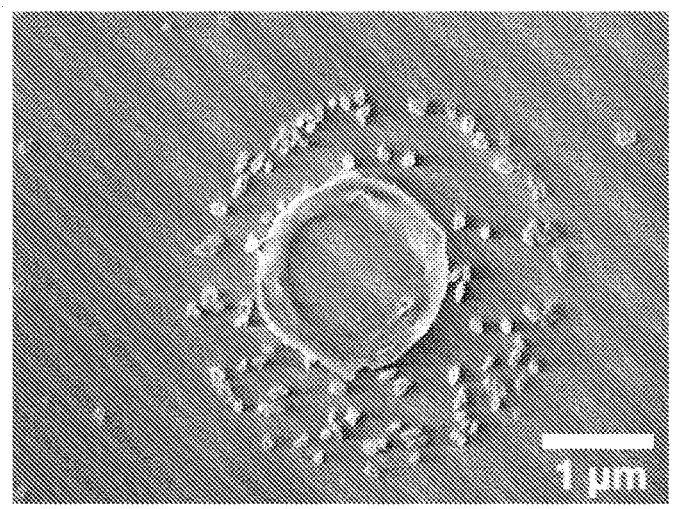
FIGS. 9 and 10 are micrographs of active growth materials and/or precursors thereof, according to some embodiments.
Figure 10:
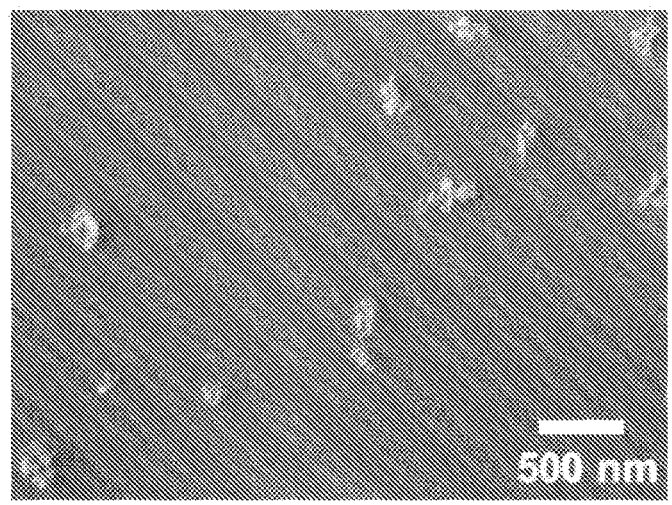

After carbon-based nanostructure growth, the coated silicon wafer and the carbon-based nanostructures thereon were characterized using field-emission scanning electron microscopy (by employing a JEOL 6700 with a 1 kV acceleration voltage) and by micro-Raman spectroscopy (by employing a Horiba LabRAM with a 532 nm laser excitation). Two different morphologies were observed: a "danish pastry" morphology as shown in FIG. 6 and a cubic morphology as shown in FIG. 7, both of which exhibited G/D ratios of approximately 1.2 (FIG. 8). It is believed that the former morphology resulted from agglomeration of initially separate nanoparticles during annealing while the latter was formed during the dip coating process and remained substantially unchanged during carbon-based nanostructure growth. Both morphologies also exhibited a weak G' peak, which was indicative of crystalline graphitic layers. By way of comparison, FIGS. 9 and 10 show representative micrographs of active growth materials and precursors thereof after being subjected to the heating and annealing steps described above but not subjected to conditions suitable for carbon-based nanostructure growth.

Example 2

This Example describes the effect of annealing conditions on the growth of carbon-based nanostructures from a $Li_xK_yCl_z$ active growth material.

Figure 11:
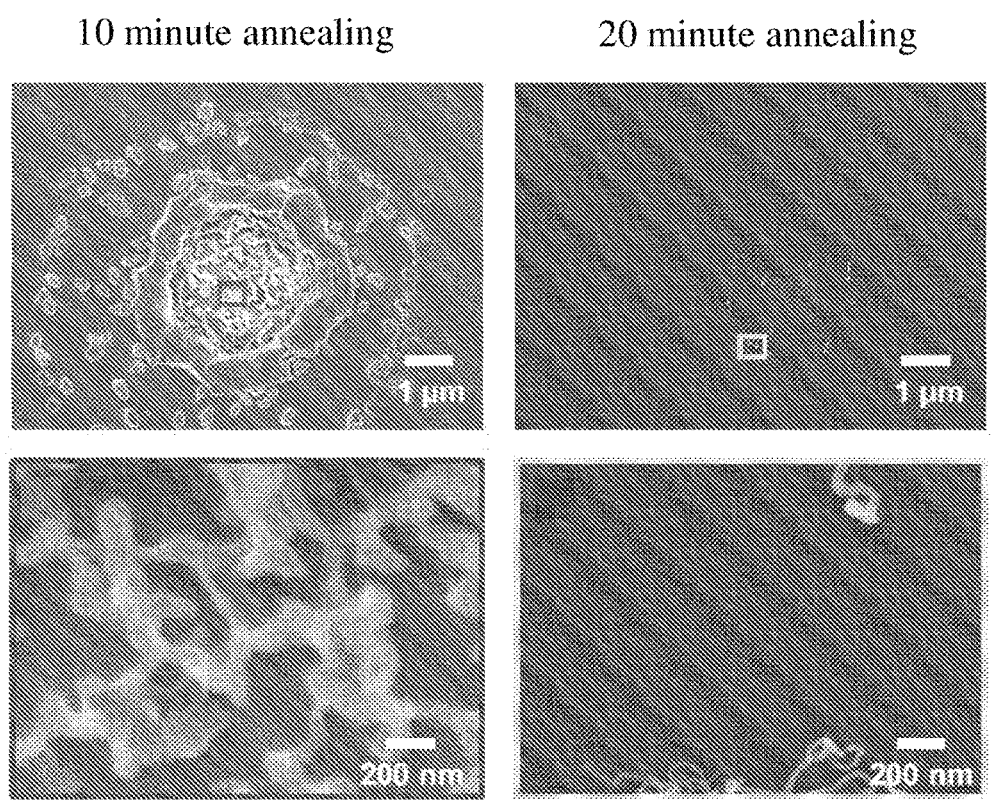
FIG. 11 contains micrographs of carbon-based nanostructures, according to some embodiments.
Figure 12:
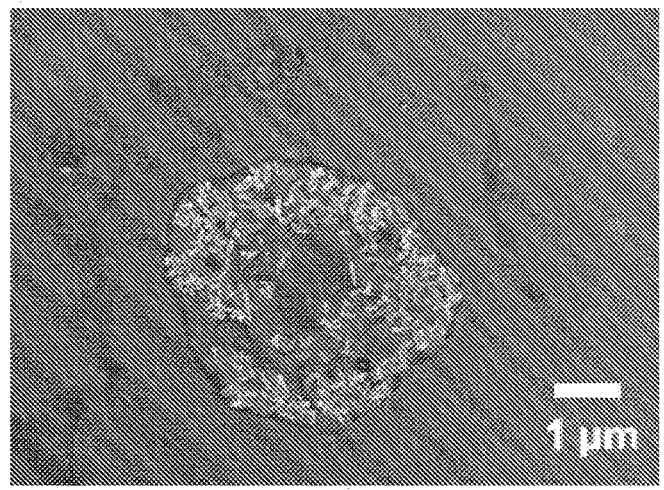
FIGS. 12 and 13 are micrographs of active growth materials and/or precursors thereof, according to some embodiments.
Figure 13:
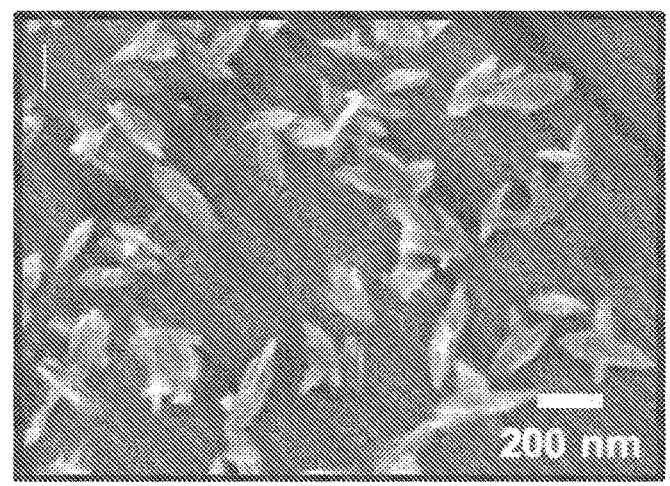

Silicon wafers on which a 200 nm thick thermally grown oxide layer was disposed were cleaned and coated as described in Example 1. These coated silicon wafers were subject to the sequential gas flows described in Example 1, except that the annealing step was changed from 10 minutes under 400 sccm $H_2$ gas flow to either 20 minutes under 400 sccm $H_2$ gas flow or 20 minutes under 400 sccm He gas flow. As can be seen in FIG. 11, carbon-based nanostructures formed after annealing the active growth material and/or precursor thereof for 20 minutes under 400 sccm $H_2$ gas flow exhibited an average diameter (20 nm) that was approximately ⅕ of the average diameter of the carbon-based nanostructures formed after annealing the active growth material as described in Example 1 (100 nm). The carbon-based nanostructures formed after annealing the active growth material and/or precursor thereof for 20 minutes under 400 sccm $H_2$ gas flow also did not appear to be attached to an active growth material. As also shown in FIGS. 12 and 13, carbon-based nanostructures were not observed to grow from the active growth materials and/or precursors thereof annealed for 20 minutes under 400 sccm He gas flow.

Example 3

This Example describes the effect of gas flow composition on the growth of carbon-based nanostructures from a $Li_xK_yCl_z$ active growth material.

Figure 14:
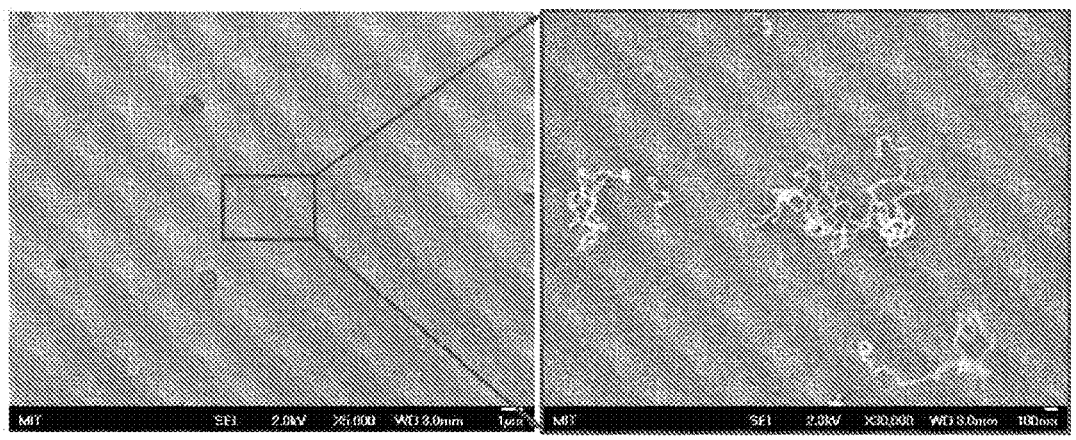
FIG. 14 is a micrograph showing carbon-based nanostructures, according to some embodiments.

Silicon wafers on which a 200 nm thick thermally grown oxide layer was disposed were cleaned and coated as described in Example 1. These coated silicon wafers were subject to the sequential gas flows described in Example 1, except that the gas flow after annealing was 10 sccm of 10 vol % acetylene in Ar, 30 sccm of $CO_2$, and 260 sccm of Ar. After this process, micrographs were formed of the coated silicon wafers and the carbon-based nanostructures which formed thereon, as shown in FIG. 14.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method of growing carbon-based nanostructures, comprising:
    exposing a precursor of the carbon-based nanostructures to an active growth material to grow the carbon-based nanostructures from the precursor of the carbon-based nanostructures,
    wherein:
        the active growth material comprises at least a first component and a second component that are capable of forming a eutectic composition with each other; and
        the active growth material comprises at least one nanoscale feature.

2. The method of claim 1, wherein the first component and the second component are present in the active growth material in relative amounts such that, were the components heated to form a liquid mixture and subsequently cooled under equilibrium conditions, greater than or equal to 5 wt % of the active growth material would solidify at and/or below the eutectic temperature.

3. The method of claim 2, wherein the eutectic temperature is greater than or equal to 25° C. and less than or equal to 770° C.

4. The method of claim 1, wherein greater than or equal to 5 wt % of the active growth material is made up of a eutectic aggregation.

5. The method of claim 1, wherein a most abundant component of the active growth material is within 35 at % of its abundance at a eutectic composition of the active growth material.

6. The method of claim 1, wherein the active growth material comprises $Li_xK_yCl_z$, and wherein each of x, y, and z are non-zero and positive.

7. The method of claim 1, wherein the active growth material is supported by a substrate that undergoes a phase change or a substantial loss of mass when at a temperature below 800° C. in a 100% nitrogen atmosphere.

8. The method of claim 1, wherein the active growth material is supported on a polymeric substrate.

9. The method of claim 1, wherein the active growth material is supported on a sized carbon fiber.

10. The method of claim 1, wherein the carbon-based nanostructures comprise at least one of carbon nanotubes, carbon nanofibers, and carbon nanowires.

11. The method of claim 1, wherein the active growth material is supported on a substrate having a sheet resistance, at 20° C., of less than or equal to 1 ohm/square.

12. The method of claim 1, wherein the active growth material is in the form of particles.

13. The method of claim 1, wherein the active growth material is at a temperature of less than or equal to 500° C. during the growth of the carbon-based nanostructures.

14. The method of claim 1, wherein the active growth material is at a temperature of greater than or equal to 200° C. and less than or equal to 500° C. during the growth of the carbon-based nanostructures.

15. The method of claim 1, wherein the precursor is a gaseous precursor, and the exposing comprises establishing direct contact between the gaseous precursor and the active growth material such that the carbon-based nanostructures are grown from the gaseous precursor directly on the active growth material.

16. The method of claim 1, wherein the active growth material is a solid active growth material.

17. The method of claim 1, wherein the active growth material comprises nanoparticles having maximum cross-sectional dimensions of less than 1 micron.

18. A method of growing carbon-based nanostructures, comprising:
   exposing a precursor of the carbon-based nanostructures to an active growth material to grow the carbon-based nanostructures from the precursor of the carbon-based nanostructures,
   wherein the active growth material comprises:
      a first type of cation, wherein the first type of cation is an alkali metal cation or an alkaline earth metal cation;
      a second type of cation different from the first type of cation, wherein the second type of cation is an alkali metal cation or an alkaline earth metal cation;
      an anion; and
      at least one nanoscale feature.

19. The method of claim 18, wherein the first type of cation is an alkali metal cation.

20. The method of claim 18, wherein the first type of cation is an alkali metal cation and the second type of cation is an alkali metal cation.

21. The method of claim 18, wherein the first type of cation is a lithium cation.

22. The method of claim 18, wherein the second type of cation is a potassium cation.

23. The method of claim 18, wherein the first type of cation is a lithium cation and the second type of cation is a potassium cation.

24. The method of claim 18, wherein the anion is a halide anion.

25. The method of claim 18, wherein the anion is a chloride anion.

26. The method of claim 18, wherein lithium cations, potassium cations, and chloride anions together make up greater than or equal to 5 wt % of the active growth material.

27. The method of claim 18, wherein at least 5% of the carbon-based nanostructures that are grown are in direct contact with at least one of the first type of cation, the second type of cation, and the anion.

28. The method of claim 18, wherein the active growth material is a solid active growth material.

29. The method of claim 18, wherein the active growth material comprises nanoparticles having maximum cross-sectional dimensions of less than 1 micron.

30. An article, comprising:
   a substrate;
   a carbon-based nanostructure supported by the substrate; and
   an active growth material comprising a eutectic composition in contact with the carbon-based nanostructure;
   wherein the active growth material comprises at least one nanoscale feature.

31. The article of claim 30, wherein the active growth material is a solid active growth material.

32. The article of claim 30, wherein the active growth material comprises nanoparticles having maximum cross-sectional dimensions of less than 1 micron.

33. The article of claim 30, wherein the carbon-based nanostructures comprise at least one of carbon nanotubes, carbon nanofibers, and carbon nanowires.

34. The article of claim 30, wherein the substrate has a sheet resistance, at 20° C., of less than or equal to 1 ohm/square.

* * * * *